United States Patent
Baraniuk et al.

(10) Patent No.: US 8,456,345 B2
(45) Date of Patent: Jun. 4, 2013

(54) METHOD AND APPARATUS FOR SIGNAL RECONSTRUCTION FROM SATURATED MEASUREMENTS

(75) Inventors: Richard G. Baraniuk, Houston, TX (US); Jason N. Laska, Houston, TX (US); Petros T. Boufounos, Boston, MA (US); Mark A. Davenport, Los Altos Hills, CA (US)

(73) Assignee: William Marsh Rice University, Houston, TX (US)

( * ) Notice: Subject to any disclaimer, the term of this patent is extended or adjusted under 35 U.S.C. 154(b) by 99 days.

(21) Appl. No.: 13/033,212

(22) Filed: Feb. 23, 2011

(65) Prior Publication Data

US 2011/0241917 A1    Oct. 6, 2011

Related U.S. Application Data

(60) Provisional application No. 61/306,994, filed on Feb. 23, 2010.

(51) Int. Cl.
*H03M 1/12*    (2006.01)
(52) U.S. Cl.
USPC ............................................. 341/155; 341/87
(58) Field of Classification Search
CPC ....................................................... H03M 1/12
USPC ............................................. 341/155, 87, 50
See application file for complete search history.

(56) References Cited

U.S. PATENT DOCUMENTS

| | | | |
|---|---|---|---|
| 5,974,361 A * | 10/1999 | Vu et al. ........................... | 702/69 |
| 6,072,310 A * | 6/2000 | Krebs et al. ................ | 324/117 R |
| 7,271,747 B2 | 9/2007 | Baraniuk et al. | |
| 7,511,643 B2 | 3/2009 | Baraniuk et al. | |
| 7,525,572 B2 * | 4/2009 | Katoh et al. ................ | 348/208.2 |
| 8,229,709 B2 * | 7/2012 | Boufounos ................... | 702/196 |
| 2006/0029279 A1 | 2/2006 | Donoho | |

OTHER PUBLICATIONS

J. Tropp, J. Laska, M. Duarte, J. Romberg, and R. Baraniuk, "Beyond Nyquist: Efficient sampling of sparse, bandlimited signals," to appear in IEEE Trans. Inform. Theory, 2009.
J. Romberg, "Compressive sensing by random convolution," to appear in SIAM J. Imaging Sciences, 2009.
J. Tropp, M. Wakin, M. Duarte, D. Baron, and R. Baraniuk, "Random filters for compressive sampling and reconstruction," in Proc. IEEE Int. Conf. Acoustics, Speech, and Signal Processing (ICASSP), Toulouse, France, May 2006.

(Continued)

*Primary Examiner* — Brian Young
(74) *Attorney, Agent, or Firm* — 24IP Law Group; Timothy R. DeWitt

(57) ABSTRACT

A method for recovering a signal by measuring the signal to produce a plurality of compressive sensing measurements, discarding saturated measurements from the plurality of compressive sensing measurements and reconstructing the signal from remaining measurements from the plurality of compressive sensing measurements. Alternatively, a method for recovering a signal comprising the steps of measuring a signal to produce a plurality of compressive sensing measurements, identifying saturated measurements in the plurality of compressive sensing measurements and reconstructing the signal from the plurality of compressive sensing measurements, wherein the recovered signal is constrained such that magnitudes of values corresponding to the identified saturated measurements are greater than a predetermined value.

14 Claims, 7 Drawing Sheets

OTHER PUBLICATIONS

M. Duarte, M. Davenport, D. Takhar, J. Laska, T. Sun, K. Kelly, and R. Baraniuk, "Single-pixel imaging via compressive sampling," IEEE Signal Processing Mag., vol. 25, No. 2, pp. 83-91, 2008.

R. Robucci, L. Chiu, J. Gray, J. Romberg, P. Hasler, and D. Anderson, "Compressive sensing on a CMOS separable transform image sensor," in Proc. IEEE Int. Conf. Acoustics, Speech, and Signal Processing (ICASSP), Las Vegas, NV, Apr. 2008.

R. Marcia, Z. Harmany, and R. Willett, "Compressive coded aperture imaging," in Proc. SPIE Symp. Elec. Imaging: Comput. Imaging, San Jose, CA, Jan. 2009.

Y. Eldar and M. Mishali, "Robust recovery of signals from a structured union of subspaces," to appear in IEEE Trans. Inform. Theory, 2009.

M. Mishali, Y. Eldar, and J. Tropp, "Efficient sampling of sparse wideband analog signals," in Proc. Conv. IEEE in Israel (IEEEI), Eilat, Israel, Dec. 2008.

M. Mishali and Y. Eldar, "From theory to practice: Sub-Nyquist sampling of sparse wideband analog signals," Preprint, 2009.

G. Gray and G. Zeoli, "Quantization and saturation noise due to analog-to-digital conversion," IEEE Trans. Aerospace and Elec. Systems, vol. 7, No. 1, pp. 222-223, 1971.

R. Walden, "Analog-to-digital converter survey and analysis," IEEE J. Selected Areas in Comm., vol. 17, 15 No. 4, pp. 539-550, 1999.

R. Baraniuk, M. Davenport, R. DeVore, and M. Wakin, "A simple proof of the restricted isometry property for random matrices," Const. Approx., vol. 28, No. 3, pp. 253-263, 2008.

E. Cand'es, "The restricted isometry property and its implications for compressed sensing," Comptes rendus de l'Acad 'emie des Sciences, S'erie I, vol. 346, No. 9-10, pp. 589-592, 2008.

E. Cand'es and T. Tao, "The Dantzig selector: Statistical estimation when p is much larger than n," Annals of Statistics, vol. 35, No. 6, pp. 2313-2351, 2007.

P. Wojtaszczyk, "Stability and instance optimality for Gaussian measurements in compressed sensing," to appear in Found. Comput. Math., 2009.

D. Donoho, "Compressed sensing," IEEE Trans. Inform. Theory, vol. 6, No. 4, pp. 1289-1306, 2006.

J. Treichler, M. Davenport, and R. Baraniuk, "Application of compressive sensing to the design of wideband signal acquisition receivers," in U.S./Australia Joint Work. Defense Apps. of Signal Processing (DASP), Lihue, Hawaii, Sep. 2009.

E. Cand'es, "Compressive sampling," in Proc. Int. Congress Math., Madrid, 20 Spain, Aug. 2006.

M. Vetterli, P. Marziliano, and T. Blu, "Sampling signals with finite rate of innovation," IEEE Trans. Signal Processing, vol. 50, No. 6, pp. 1417-1428, 2002.

J. Laska, S. Kirolos, M. Duarte, 10 T. Ragheb, R. Baraniuk, and Y. Massoud, "Theory and implementation of an analog-to-information converter using random demodulation," in Proc. IEEE Int. Symp. Circuits and Systems (ISCAS), New Orleans, LA, May 2007.

L. Jacques, D. Hammond, and M. Fadili, "Dequantizing compressed sensing: When oversampling and non-gaussian contraints combine," Preprint, 2009.

W. Dai, H. Pham, and O. Milenkovic, "Distortionrate functions for quantized compressive sensing," Preprint, 2009.

A. Zymnis, S. Boyd, and E. Cand'es, "Compressed sensing with quantized measurements," Preprint, 2009.

J. Sun and V. Goyal, "Quantization for compressed sensing reconstruction," in Proc. Sampling Theory and 5 Applications (SampTA), Marseille, France, May 2009.

R. Carrillo, K. Barner, and T. Aysal, "Robust sampling and reconstruction methods for compressed sensing," in Proc. IEEE Int. Conf. Acoustics, Speech, and Signal Processing (ICASSP), Taipei, Taiwan, Apr. 20, 2009.

J. Laska, M. Davenport, and R. Baraniuk, "Exact signal recovery from corrupted measurements through the pursuit of justice," in Proc. Asilomar Conf. on Signals Systems and Computers, Asilomar, CA, Nov. 2009.

Z. Harmany, R. Marcia, and R. Willett, "Sparse Poisson intensity reconstruction algorithms," in Proc. IEEE Work. Stat. Signal Processing (SSP), Cardiff, Wales, Aug. 2009.

I. Rish and 25 G. Grabarnik, "Sparse signal recovery with exponential-family noise," in Proc. Allerton Conf. Comm., Control, and Comput., Monticello, IL, Sep. 2009.

J. Tropp, M. Wakin, M. Duarte, D. Baron, and R. Baraniuk, "Random filters for compressive sampling and reconstruction," in Proc. IEEE 20 Int. Conf. Acoustics, Speech, and Signal Processing (ICASSP), Toulouse, France, May 2006.

E. Cand'es and T. Tao, "Decoding by linear programming," IEEE Trans. Inform. Theory, vol. 51, No. 12, pp. 4203-4215, 2005.

J. Laska, P. Boufounos, and R. Baraniuk, "Finite-range scalar quantization for compressive sensing," in Proc. Sampling Theory and Applications (SampTA), Marseille, France, May 2009.

M. Davenport, M. Duarte, M. Wakin, J. Laska, D. Takhar, K. Kelly, and R. Baraniuk, "The smashed filter for compressive classification and target recognition," in Proc. SPIE Elec. Imaging: Comput. Imaging, San Jose, CA, Jan. 2007.

D. Needell and J. Tropp, "CoSaMP: Iterative signal recovery from incomplete and inaccurate samples," Appl. 5 Comput. Harmon. Anal., vol. 26, No. 3, pp. 301-321, 2009.

T. Blumensath and M. Davies, "Iterative hard thresholding for compressive sensing," Appl. Comput. Harmon. Anal., vol. 27, No. 3, pp. 265-274, 2009.

P. Boufounos and R. Baraniuk, "1-bit compressive sensing," in Proc. Conf. Inform. Science and Systems (CISS), Princeton, NJ, Mar. 2008.

M. Davenport, P. Boufounos, and R. Baraniuk, "Compressive domain interference cancellation," in Structure et parcimonie pour la repr'esentation adaptative de signaux (SPARS), Saint-Malo, France, Apr. 2009.

F. Beutler, "Error-free recovery of signals from irregularly spaced samples," SIAM Rev., vol. 8, pp. 328-335, Jul. 1966.

A. Aldroubi and K. Grochenig, "Nonuniform sampling and reconstruction in shift-invariant spaces," SIAM Rev., vol. 43, No. 4, 10 pp. 585-620, 2001.

E. Cand'es, J. Romberg, and T. Tao, "Stable signal recovery from incomplete and inaccurate measurements," Comm. Pure and Appl. Math., vol. 59, No. 8, pp. 1207-1223, 2006.

R. DeVore, B. Jawerth, and B. Lucier, "Image compression 30 through wavelet transform coding," IEEE Trans. Inform. Theory, vol. 38, No. 2, 1992.

* cited by examiner

METHOD AND APPARATUS FOR SIGNAL RECONSTRUCTION FROM SATURATED MEASUREMENTS

CROSS-REFERENCE TO RELATED APPLICATIONS

The present application claims the benefit of the filing date of U.S. Provisional Patent Application Ser. No. 61/306,994 filed by the present inventors on Feb. 23, 2010.

The aforementioned provisional patent application is hereby incorporated by reference in its entirety.

STATEMENT REGARDING FEDERALLY SPONSORED RESEARCH OR DEVELOPMENT

This invention was made with government support under National Science Foundation Grant Nos. CCF-0431150, CCF-0728867, CNS-0435425 and CNS-0520280, DARPA Grant No. N66001-08-1-2065, Office of Naval Research Grant Nos. N00014-07-1-0936, N00014-08-1-1067, N00014-08-1-1112, and N00014-08-1-1066, Air Force Office of Scientific Research Grant Nos. FA9550-07-1-0301, and Department of Defense-Army Research Laboratory Grant Nos W911NF-07-1-0185, and W911NF-09-1-0383. The government has certain rights in the invention.

1 BACKGROUND OF THE INVENTION 1.1 Field of the Invention

The present invention relates generally to methods and apparatus for signal reconstruction and more specifically to methods and apparatus for recovering sparse signals from finite-range, quantized compressive sensing measurements.

1.2 Brief Description of the Related Art

Analog-to-digital converters (ADCs) are an essential component in digital sensing and communications systems. They interface the analog physical world, where many signals originate, with the digital world, where they can be efficiently analyzed and processed. As digital processors have become smaller and more powerful, their increased capabilities have inspired applications that require the sampling of ever-higher bandwidth signals. This demand has placed a growing burden on ADCs. As ADC sampling rates push higher, they move toward a physical barrier, beyond which their design becomes increasingly difficult and costly. R. Walden, "Analog-to-digital converter survey and analysis," *IEEE J. Selected Areas in Comm.*, vol. 17, no. 4, pp. 539-550, 1999.

Fortunately, recent theoretical developments in the area of compressive sensing (CS) have the potential to significantly extend the capabilities of current ADCs to keep pace with demand. D. Donoho, "Compressed sensing," *IEEE Trans. Inform. Theory*, vol. 6, no. 4, pp. 1289-1306, 2006, E. Candès, "Compressive sampling," in *Proc. Int. Congress Math.*, Madrid, Spain, August 2006. CS provides a framework for sampling signals at a rate proportional to their information content rather than their bandwidth, as in Shannon-Nyquist systems. In CS, the information content of a signal is quantified as the number of nonzero coefficients in a known transform basis over a fixed time interval M. Vetterli, P. Marziliano, and T. Blu, "Sampling signals with finite rate of innovation," *IEEE Trans. Signal Processing*, vol. 50, no. 6, pp. 1417-1428, 2002. Signals that have few nonzero coefficients are called sparse signals. More generally, signals with coefficient magnitudes that decay rapidly are called compressible, because they can be well-approximated by sparse signals. By exploiting sparse and compressible signal models, CS provides a methodology for simultaneously acquiring and compressing signals. This leads to lower sampling rates and thus simplifies hardware designs. The CS measurements can be used to reconstruct the signal or can be directly processed to extract other kinds of information.

The CS framework employs non-adaptive, linear measurement systems and non-linear reconstruction algorithms. In most cases, CS systems exploit a degree of randomness in order to provide theoretical guarantees on the performance of the system. Such systems exhibit additional desirable properties beyond lower sampling rates. In particular, the measurements are democratic, meaning that each measurement contributes an equal amount of information to the compressed representation. This is in contrast to both conventional sampling systems and conventional compression algorithms, where the removal of some samples or bits can lead to high distortion, while the removal of others will have negligible effect.

Several CS-inspired hardware architectures for acquiring signals, images, and videos have been proposed, analyzed, and in some cases implemented. J. Laska, S. Kirolos, M. Duarte, T. Ragheb, R. Baraniuk, and Y. Massoud, "Theory and implementation of an analog-to-information converter using random demodulation," in *Proc. IEEE Int. Symp. Circuits and Systems (ISCAS)*, New Orleans, La., May 2007, J. Tropp, J. Laska, M. Duarte, J. Romberg, and R. Baraniuk, "Beyond Nyquist: Efficient sampling of sparse, bandlimited signals," *IEEE Trans. Inform. Theory*, 2009, J. Romberg, "Compressive sensing by random convolution," *SIAM J. Imaging Sciences*, 2009, J. Tropp, M. Wakin, M. Duarte, D. Baron, and R. Baraniuk, "Random filters for compressive sampling and reconstruction," in Proc. IEEE Int. Conf. Acoustics, Speech, and Signal Processing (ICASSP), Toulouse, France, May 2006, M. Duarte, M. Davenport, D. Takhar, J. Laska, T. Sun, K. Kelly, and R. Baraniuk, "Single-pixel imaging via compressive sampling," *IEEE Signal Processing Mag.*, vol. 25, no. 2, pp. 83-91, 2008, R. Robucci, L. Chiu, J. Gray, J. Romberg, P. Hasler, and D. Anderson, "Compressive sensing on a CMOS separable transform image sensor," in *Proc. IEEE Int. Conf. Acoustics, Speech, and Signal Processing (ICASSP)*, Las Vegas, Nev., April 2008, R. Marcia, Z. Harmany, and R. Willett, "Compressive coded aperture imaging," in *Proc. SPIE Symp. Elec. Imaging: Comput. Imaging*, San Jose, Calif., January 2009, Y. Eldar and M. Mishali, "Robust recovery of signals from a structured union of subspaces," *IEEE Trans. Inform. Theory*, 2009, M. Mishali, Y. Eldar, and J. Tropp, "Efficient sampling of sparse wideband analog signals," in *Proc. Cony. IEEE in Israel (IEEEI)*, Eilat, Israel, December 2008, M. Mishali and Y. Eldar, "From theory to practice: Sub-Nyquist sampling of sparse wideband analog signals," *Preprint*, 2009, Y. Eldar and M. Mishali, "Robust recovery of signals from a structured union of subspaces," *IEEE Trans. Inform. Theory*, 2009. The common element in each of these acquisition systems is that the measurements are ultimately quantized, i.e., mapped from real-values to a set of countable values, before they are stored or transmitted. The present invention focuses on this quantization step.

While the effect of quantization on the CS framework has been previously explored L. Jacques, D. Hammond, and M. Fadili, "Dequantizing compressed sensing: When oversampling and non-gaussian contraints combine," *Preprint*, 2009, W. Dai, H. Pham, and O. Milenkovic, "Distortion-rate functions for quantized compressive sensing," *Preprint*, 2009, A. Zymnis, S. Boyd, and E. Candès, "Compressed sensing with quantized measurements," *Preprint*, 2009, J. Sun and V. Goyal, "Quantization for compressed sensing reconstruction," in *Proc. Sampling Theory and Applications (SampTA)*, Marseille, France, May 2009, prior work has ignored saturation. Saturation occurs when measurement values exceed the saturation level, i.e., the dynamic range of a quantizer. These measurements take on the value of the saturation level. All practical quantizers have a finite dynamic range for one of two reasons, or both: (i) physical limitations allow only a finite range of voltages to be accurately converted to bits and, (ii) only a finite number of bits are available to represent each value. Quantization with saturation is commonly referred to as finite-range quantization.

The challenge in dealing with the errors imposed by finite-range quantization is that, in the absence of an a priori upper bound on the measurements, saturation errors are potentially unbounded. Most CS recovery algorithms only provide guarantees for noise that is either bounded or bounded with high probability (for example, Gaussian noise). E. Candès and T. Tao, "The Dantzig selector: Statistical estimation when p is much larger than n," *Annals of Statistics*, vol. 35, no. 6, pp. 2313-2351, 2007. The only exceptions are R. Carrillo, K. Barner, and T. Aysal, "Robust sampling and reconstruction methods for compressed sensing," in *Proc. IEEE Int. Conf. Acoustics, Speech, and Signal Processing (ICASSP)*, Taipei, Taiwan, April 2009, J. Laska, M. Davenport, and R. Baraniuk, "Exact signal recovery from corrupted measurements through the pursuit of justice," in *Proc. Asilomar Conf. on Signals Systems and Computers*, Asilomar, Calif., November 2009, which consider sparse or impulsive noise models, and Z. Harmany, R. Marcia, and R. Willett, "Sparse poisson intensity reconstruction algorithms," in *Proc. IEEE Work. Stat. Signal Processing (SSP)*, Cardiff, Wales, August 2009, I. Rish and G. Grabarnik, "Sparse signal recovery with exponential-family noise," in *Proc. Allerton Conf. Comm., Control, and Comput.*, Monticello, Ill., September 2009, which consider unbounded noise from the exponential family of distributions. None of the methods in R. Carrillo, K. Barner, and T. Aysal, "Robust sampling and reconstruction methods for compressed sensing," in *Proc. IEEE Int. Conf. Acoustics, Speech, and Signal Processing (ICASSP)*, Taipei, Taiwan, April 2009, J. Laska, M. Davenport, and R. Baraniuk, "Exact signal recovery from corrupted measurements through the pursuit of justice," in *Proc. Asilomar Conf. on Signals Systems and Computers*, Asilomar, Calif., November 2009, Z. Harmany, R. Marcia, and R. Willett, "Sparse poisson intensity reconstruction algorithms," in *Proc. IEEE Work. Stat. Signal Processing (SSP)*, Cardiff, Wales, August 2009, I. Rish and G. Grabarnik, "Sparse signal recovery with exponential-family noise," in *Proc. Allerton Conf. Comm., Control, and Comput.*, Monticello, Ill., September 2009 can be used to handle unbounded quantization errors due to saturation.

1.2.1 Analog-to-Digital Conversion

ADC consists of two discretization steps: sampling, which converts a continuous-time signal to a discrete-time set of measurements, followed by quantization, which converts the continuous value of each measurement to a discrete one chosen from a pre-determined, finite set. Both steps are necessary to represent an analog signal in the discrete digital world.

The discretization step can be lossless or lossy. For example, classical results due to Shannon and Nyquist demonstrate that the sampling step induces no loss of information, provided that the signal is bandlimited and a sufficient number of measurements (or samples) are obtained. Similarly, sensing of images assumes that the image is sufficiently smooth such that the integration of light in each pixel of the sensor is sufficient for a good quality representation of the image. The present description assumes the existence of a discretization that exactly represents the signal, or approximates to sufficient quality. Examples of such discretizations and their implementation in the context of compressive sensing can be found in J. Tropp, J. Laska, M. Duarte, J. Romberg, and R. Baraniuk, "Beyond Nyquist: Efficient sampling of sparse, bandlimited signals," *IEEE Trans. Inform. Theory*, 2009, J. Romberg, "Compressive sensing by random convolution," *SIAM J. Imaging Sciences*, 2009, J. Tropp, M. Wakin, M. Duarte, D. Baron, and R. Baraniuk, "Random filters for compressive sampling and reconstruction," in *Proc. IEEE Int. Conf. Acoustics, Speech, and Signal Processing (ICASSP)*, Toulouse, France, May 2006, M. Duarte, M. Davenport, D. Takhar, J. Laska, T. Sun, K. Kelly, and R. Baraniuk, "Single-pixel imaging via compressive sampling," *IEEE Signal Processing Mag.*, vol. 25, no. 2, pp. 83-91, 2008, R. Robucci, L. Chiu, J. Gray, J. Romberg, P. Hasler, and D. Anderson, "Compressive sensing on a CMOS separable transform image sensor," in *Proc. IEEE Int. Conf. Acoustics, Speech, and Signal Processing (ICASSP)*, Las Vegas, Nev., April 2008, R. Marcia, Z. Harmany, and R. Willett, "Compressive coded aperture imaging," in *Proc. SPIE Symp. Elec. Imaging: Comput. Imaging*, San Jose, Calif., January 2009, Y. Eldar and M. Mishali, "Robust recovery of signals from a structured union of subspaces," *IEEE Trans. Inform. Theory*, 2009, M. Mishali, Y. Eldar, and J. Tropp, "Efficient sampling of sparse wideband analog signals," in *Proc. Cony. IEEE in Israel (IEEEI)*, Eilat, Israel, December 2008, M. Mishali and Y. Eldar, "From theory to practice: Sub-Nyquist sampling of sparse wideband analog signals," *Preprint*, 2009, Y. Eldar and M. Mishali, "Robust recovery of signals from a structured union of subspaces," *IEEE Trans. Inform. Theory*, 2009. Aspects of such systems in are briefly discussed below in Sec. 1.2.4.

TABLE 1

Quantization parameters.

| | |
|---|---|
| G | saturation level |
| B | number of bits |
| Δ | bin width |
| Δ/2 | maximum error per (quantized) measurement |
| unbounded | maximum error per (saturated) measurement |

Instead the present invention focuses on the second aspect of digitization, namely quantization. Quantization results in an irreversible loss of information unless the measurement amplitudes belong to the discrete set defined by the quantizer. A central ADC system design goal is to minimize the distortion due to quantization.

1.2.2 Scalar Quantization

Scalar quantization is the process of converting the continuous value of an individual measurement to one of several discrete values through a non-invertible function $R(\cdot)$. Practical quantizers introduce two kinds of distortion: bounded quantization error and unbounded saturation error.

In this application, the focus is on uniform quantizers with quantization interval $\Delta$. Thus, the quantized values become $q_k = q_o + k\Delta$, for $k \in \mathbb{Z}$, and every measurement g is quantized to the nearest quantization level $R(g) = \mathrm{argmin}_{q_k} |g - q_k| = \Delta/2 + k\Delta$, the midpoint of each quantization interval. This minimizes the expected quantization distortion and implies that the quantization error per measurement, $|g - R(q)|$, is bounded by $\Delta/2$. FIG. 1A depicts the mapping performed by a midrise quantizer.

In practice, quantizers have a finite dynamic range, dictated by hardware constraints such as the voltage limits of the devices and the finite number of bits per measurement of the quantized representation. Thus, a finite-range quantizer represents a symmetric range of values $|g| < G$, where $G > 0$ is known as the saturation level G. Gray and G. Zeoli, "Quantization and saturation noise due to analog-to-digital conversion," *IEEE Trans. Aerospace and Elec. Systems*, vol. 7, no. 1, pp. 222-223, 1971. Values of g between −G and G will not saturate, thus, the quantization interval is defined by these parameters as $\Delta=2^{-B+1}G$. Without loss of generality we assume a midrise B-bit quantizer, i.e., the quantization levels are $q_k = \Delta/2 - k\Delta$, where $k = -2^{B-1}, \ldots 2^{B-1} - 1$. Any measurement with magnitude greater than G saturates the quantizer, i.e., it quantizes to the quantization level $G - \Delta/2$, implying an unbounded error. FIG. 1B depicts the mapping performed by a finite range midrise quantizer with saturation level G and Table 1 summarizes the parameters defined with respect to quantization.

1.2.3 Compressive Sensing (CS)

In the CS framework, one acquires a signal $x \in \mathbb{R}^N$ via the linear measurements $$y = \Phi x + e, \quad (1)$$

where $\Phi$ is an M×N measurement matrix modeling the sampling system, $y \in \mathbb{R}^M$ is the vector of samples acquired, and e is an M×1 vector that represents measurement errors. If x is K-sparse when represented in the sparsity basis $\Psi$, i.e., $x = \Psi\alpha$ with $\|\alpha\|_0 := |\text{supp}(\alpha)| \leq K$, then one can acquire just $M = O(K \log(N/K))$ measurements and still recover the signal x. E. Candès, "Compressive sampling," in *Proc. Int. Congress Math.*, Madrid, Spain, August 2006, D. Donoho, "Compressed sensing," *IEEE Trans. Inform. Theory*, vol. 6, no. 4, pp. 1289-1306, 2006. A similar guarantee can be obtained for approximately sparse, or compressible, signals. Observe that if K is small, then the number of measurements required can be significantly smaller than the Shannon-Nyquist rate.

In E. Candès and T. Tao, "Decoding by linear programming," *IEEE Trans. Inform. Theory*, vol. 51, no. 12, pp. 4203-4215, 2005, Candès and Tao introduced the restricted isometry property (RIP) of a matrix $\Phi$ and established its important role in CS. From E. Candès and T. Tao, "Decoding by linear programming," *IEEE Trans. Inform. Theory, vol. 51, no. 12*, pp. 4203-4215, 2005, we have the definition, Definition 1

A matrix $\Phi$ satisfies the RIP of order K with constant $\delta \in (0, 1)$ if $$(1-\delta)\|x\|_2^2 \leq \|\Phi x\|_2^2 \leq (1+\delta)\|x\|_2^2 \quad (2)$$

holds for all x such that $\|x\|_0 \leq K$.

In words, $\Phi$ acts as an approximate isometry on the set of vectors that are K-sparse in the basis $\Psi$. An important result is that for any unitary matrix $\Psi$, if we draw a random matrix $\Phi$ whose entries $\phi_{ij}$ are independent realizations from a sub-Gaussian distribution, then $\Phi\Psi$ will satisfy the RIP of order K with high probability provided that $M = O(K \log(N K))$ R. Baraniuk, M. Davenport, R. DeVore, and M. Wakin, "A simple proof of the restricted isometry property for random matrices," *Const. Approx.*, vol. 28, no. 3, pp. 253-263, 2008. In this example, without loss of generality, we fix $\Psi = I$, the identity matrix, implying that $x = \alpha$.

The RIP is a necessary condition if we wish to be able to recover all sparse signals x from the measurements y. Specifically, if $\|x\|_0 = K$, then $\Phi$ must satisfy the lower bound of the RIP of order 2K with $\delta < 1$ in order to ensure that any algorithm can recover x from the measurements y. Furthermore, the RIP also suffices to ensure that a variety of practical algorithms can successfully recover any sparse or compressible signal from noisy measurements. In particular, for bounded errors of the form $\|e\|_2 \leq \epsilon$, the convex program $$\hat{x} = \operatorname*{argmin}_x \|x\|_1 \text{ s.t. } \|\Phi x - y\|_2 \leq \epsilon \quad (3)$$

can recover a sparse or compressible signal x. The following theorem, a slight modification of Theorem 1.2 from E. Candès, "The restricted isometry property and its implications for compressed sensing," *Comptes rendus de l'Académie des Sciences, Série I*, vol. 346, no. 9-10, pp. 589-592, 2008, makes this precise by bounding the recovery error of x with respect to the measurement noise norm, denoted by $\epsilon$, and with respect to the best approximation of x by its largest K terms, denoted using $x_K$.

Theorem 1.

Suppose that $\Phi\Psi$ satisfies the RIP of order 2K with $\delta < \sqrt{2} - 1$. Given measurements of the form $y = \Phi\Psi x + e$, where $\|e\|_2 \leq \epsilon$, then the solution to (3) obeys $$\|\hat{x} - x\|_2 \leq C_0 \epsilon + C_1 \frac{\|x - x_K\|_1}{\sqrt{K}},$$

where $$C_0 = \frac{4(1+\delta)}{1-(\sqrt{2}+1)\delta},$$

$$C_1 = \frac{1+(\sqrt{2}-1)\delta}{1-(\sqrt{2}+1)\delta}.$$

While convex optimization techniques like equation (3) are a powerful method for CS signal recovery, there also exist a variety of alternative algorithms that are commonly used in practice and for which performance guarantees comparable to that of Theorem 1 can be established. In particular, iterative algorithms such as CoSaMP and iterative hard thresholding (IHT) are known to satisfy similar guarantees under slightly stronger assumptions on the RIP constants. Furthermore, alternative recovery strategies based on (3) have been analyzed in E. Candès and T. Tao, "The Dantzig selector: Statistical estimation when p is much larger than n," *Annals of Statistics*, vol. 35, no. 6, pp. 2313-2351, 2007, P. Wojtaszczyk, "Stability and instance optimality for Gaussian measurements in compressed sensing," *Found. Comput. Math.*, 2009. These methods replace the constraint in (3) with an alternative constraint that is motivated by the assumption that the measurement noise is Gaussian in the case of E. Candès and T. Tao, "The Dantzig selector: Statistical estimation when p is much larger than n," *Annals of Statistics*, vol. 35, no. 6, pp. 2313-2351, 2007 and that is agnostic to the value of $\epsilon$ in P. Wojtaszczyk, "Stability and instance optimality for Gaussian measurements in compressed sensing," *Found. Comput. Math.*, 2009.

1.2.4 CS in Practice

Several hardware architectures have been proposed and implemented that allow CS to be used in practical settings with analog signals. See, for example U.S. Pat. No. 7,271,747. Other examples include the random demodulator, random filtering, and random convolution for signals J. Tropp, J. Laska, M. Duarte, J. Romberg, and R. Baraniuk, "Beyond Nyquist: Efficient sampling of sparse, bandlimited signals," *IEEE Trans. Inform. Theory*, 2009, J. Romberg, "Compressive sensing by random convolution," *SIAM J. Imaging Sciences*, 2009, J. Tropp, M. Wakin, M. Duarte, D. Baron, and R.

Baraniuk, "Random filters for compressive sampling and reconstruction," in *Proc. IEEE Int. Conf. Acoustics, Speech, and Signal Processing (ICASSP)*, Toulouse, France, May 2006, as well as the modulated wideband converter for multiband signals M. Mishali, Y. Eldar, and J. Tropp, "Efficient sampling of sparse wideband analog signals," in *Proc. Cony. IEEE in Israel (IEEEI)*, Eilat, Israel, December 2008, M. Mishali and Y. Eldar, "From theory to practice: Sub-Nyquist sampling of sparse wideband analog signals," *Preprint*, 2009, and several compressive imaging architectures M. Duarte, M. Davenport, D. Takhar, J. Laska, T. Sun, K. Kelly, and R. Baraniuk, "Single-pixel imaging via compressive sampling," *IEEE Signal Processing Mag.*, vol. 25, no. 2, pp. 83-91, 2008, R. Robucci, L. Chiu, J. Gray, J. Romberg, P. Hasler, and D. Anderson, "Compressive sensing on a CMOS separable transform image sensor," in *Proc. IEEE Int. Conf. Acoustics, Speech, and Signal Processing (ICASSP)*, Las Vegas, Nev., April 2008, R. Marcia, Z. Harmany, and R. Willett, "Compressive coded aperture imaging," in *Proc. SPIE Symp. Elec. Imaging: Comput. Imaging*, San Jose, Calif., January 2009.

The random demodulator is an example of such a System. J. Tropp, J. Laska, M. Duarte, J. Romberg, and R. Baraniuk, "Beyond Nyquist: Efficient sampling of sparse, bandlimited signals," *IEEE Trans. Inform. Theory*, 2009. FIG. 2 depicts the block diagram of the random demodulator. The four key components are a pseudo-random ±1 "chipping sequence" $p_c(t)$ operating at the Nyquist rate or higher, a low pass filter, often represented by an ideal integrator with reset, a low-rate ADC, and a quantizer. An input analog signal x(t) is modulated by the chipping sequence and integrated. The output of the integrator is sampled, and the integrator is reset after each sample. The output measurements from the ADC are then quantized.

Systems such as these represent a linear operator mapping the analog input signal to a discrete output vector, followed by a quantizer. It is possible, but beyond the scope of this description, to relate this operator to a discrete measurement matrix $\Phi$ which maps, for example, the Nyquist-rate samples of the input signal to the discrete output vector. J. Tropp, J. Laska, M. Duarte, J. Romberg, and R. Baraniuk, "Beyond Nyquist: Efficient sampling of sparse, bandlimited signals," *IEEE Trans. Inform. Theory*, 2009, M. Mishali and Y. Eldar, "From theory to practice: Sub-Nyquist sampling of sparse wideband analog signals," *Preprint*, 2009, J. Treichler, M. Davenport, and R. Baraniuk, "Application of compressive sensing to the design of wideband signal acquisition receivers," in *U.S./Australia Joint Work. Defense Apps. of Signal Processing (DASP)*, Lihue, Hi., September 2009.

2 SUMMARY OF THE INVENTION

Preferred embodiments of the present invention offer two new approaches for mitigating unbounded quantization errors caused by saturation in CS systems. The first approach simply discards saturated measurements and performs signal reconstruction without them. The second approach is based on a new CS recovery algorithm that treats saturated measurements differently from unsaturated ones. This is achieved by employing a magnitude constraint on the indices of the saturated measurements while maintaining the conventional regularization constraint on the indices of the other measurements. Both approaches are analyzed and it is shown that both can recover sparse and compressible signals with guarantees similar to those for standard CS recovery algorithms.

These methods exploit the democratic nature of CS measurements. Because each measurement contributes equally to the compressed representation, one can remove some of them and still maintain a sufficient amount of information about the signal to enable recovery. A simple analysis of the two reconstruction approaches above and yields concrete bounds on how many measurements are sufficient to ensure that the methods are robust to the saturation of some specified number of measurements.

When characterizing these methods, in order to maximize the acquisition SNR, the optimal strategy is to allow the quantizer to saturate at some nonzero rate. This is due to the inverse relationship between quantization error and saturation rate: as the saturation rate increases, the distortion of remaining measurements decreases. Experimental results show that on average, the optimal SNR is achieved at nonzero saturation rates. This demonstrates that just as CS challenges the conventional wisdom of how to sample a signal, it also challenges the conventional wisdom of avoiding saturation events.

A standard CS recovery approach like equation (3) assumes that the measurement error is bounded. However, when quantizing the measurements y, the error on saturated measurements is unbounded. Thus, conventional wisdom would suggest that the measurements should first be scaled down appropriately so that none saturate.

This approach has two main drawbacks. First, rescaling the measurements reduces the saturation rate at the cost of increasing the quantization error on each measurement that does not saturate. Saturation events may be quite rare, but the additional quantization error will affect every measurement and induce a higher reconstruction error than if the signal had not been scaled and no saturation occurred. Second, in practice, saturation events may be impossible to avoid completely.

However, unlike conventional sampling systems that employ linear interpolation-based reconstruction, where each sample contains information for only a localized portion of the signal, CS measurements contain information for a larger portion of the signal. This creates a need for non-linear reconstruction algorithms but gives rise to some practical benefits such as robustness to the loss of a small number of measurements.

In this application, two approaches are disclosed for handling saturated measurements in CS systems: saturation rejection: simply discard saturated measurements and then perform signal recovery on those that remain; constrained optimization: incorporate saturated measurements in the recovery algorithm by enforcing consistency on the saturated measurements. In order for the saturation rejection approach to work we must be able to recover the signal using only the measurements that are retained, or equivalently, using only the rows of $\Phi$ that are retained. An analysis of the properties of this matrix will be essential to understanding the performance of this approach Similarly, it unclear when the combination of the retained measurements plus the additional information provided by the saturation constraints is sufficient to recover the signal. A main result of this description, that we prove below, is that there exists a class of matrices $\Phi$ such that an arbitrary subset of their rows will indeed satisfy the RIP, in which case existing results can provide performance guarantees for both of these approaches.

In another preferred embodiment, the present invention is a method for recovering a signal comprising the steps of measuring a signal to produce a plurality of compressive sensing measurements, identifying saturated measurements in the plurality of compressive sensing measurements and reconstructing the signal from the plurality of compressive sensing measurements, wherein the recovered signal is constrained such that magnitudes of values corresponding to the identified saturated measurements are greater than a predetermined value.

In a preferred embodiment, the present invention is a method for recovering a signal comprising the steps of measuring a signal to produce a plurality of compressive sensing measurements, discarding saturated measurements from the plurality of compressive sensing measurements and reconstructing the signal from remaining measurements from the plurality of compressive sensing measurements. In another preferred embodiment, the present invention is a method for recovering a signal comprising the steps of measuring a signal to produce a plurality of compressive sensing measurements, identifying saturated measurements in the plurality of compressive sensing measurements and reconstructing the signal from the plurality of compressive sensing measurements, wherein the recovered signal is constrained such that magnitudes of values corresponding to the identified saturated measurements are greater than a predetermined value.

In yet another preferred embodiment, the present invention is a method for acquiring signals. The method comprises the steps of amplifying a signal, measuring the amplified signal to produce a plurality of compressive sensing measurements some of which are saturated, determining or identifying the saturated measurements in the plurality of compressive sensing measurements, and reconstructing the signal by separately treating the saturated and unsaturated measurements. The amplifying step may intentionally introduce saturation at the measuring step and may be controlled through an automatic gain control system. The reconstruction step may comprise the steps of discarding the saturated measurements and using only the unsaturated measurements in a reconstruction algorithm. In still another embodiment, the reconstruction step may comprise incorporating the saturated measurements as a constraint in the reconstruction algorithm.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

3 BRIEF DESCRIPTION OF THE DRAWINGS

For a more complete understanding of the present invention and the advantages thereof, reference is now made to the following description and the accompanying drawings, in which:

FIGS. 1A and 1B are drawings of a scalar quantization function. FIG. 1A shows a midrise scalar quantizer. FIG. 1B shows a finite-range midrise scalar quantizer with saturation level G.

Figure 4A:
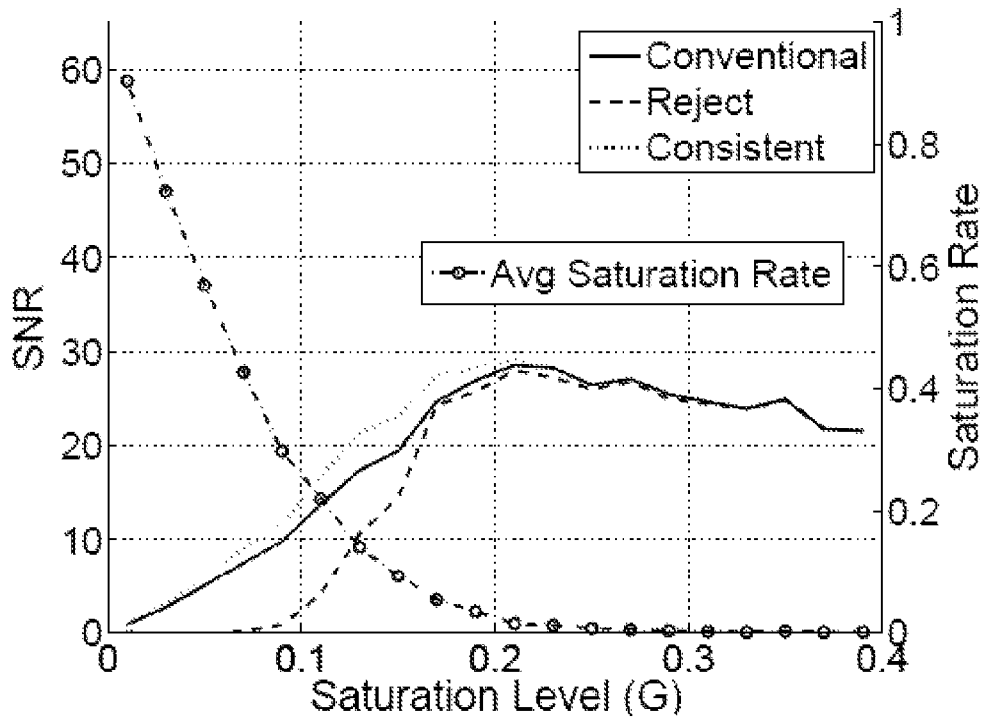
Figure 4B:
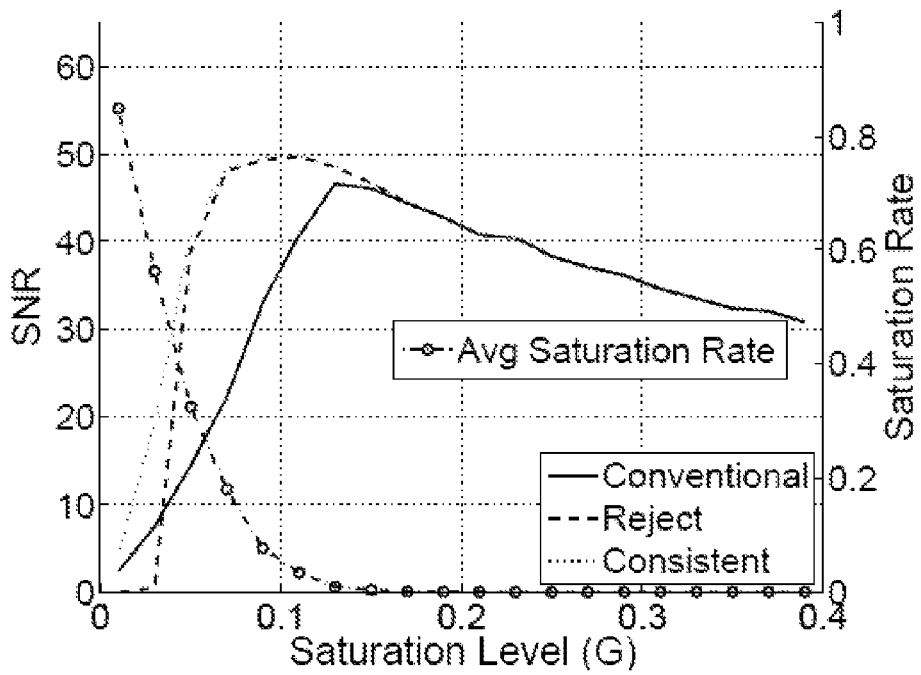
Figure 4C:
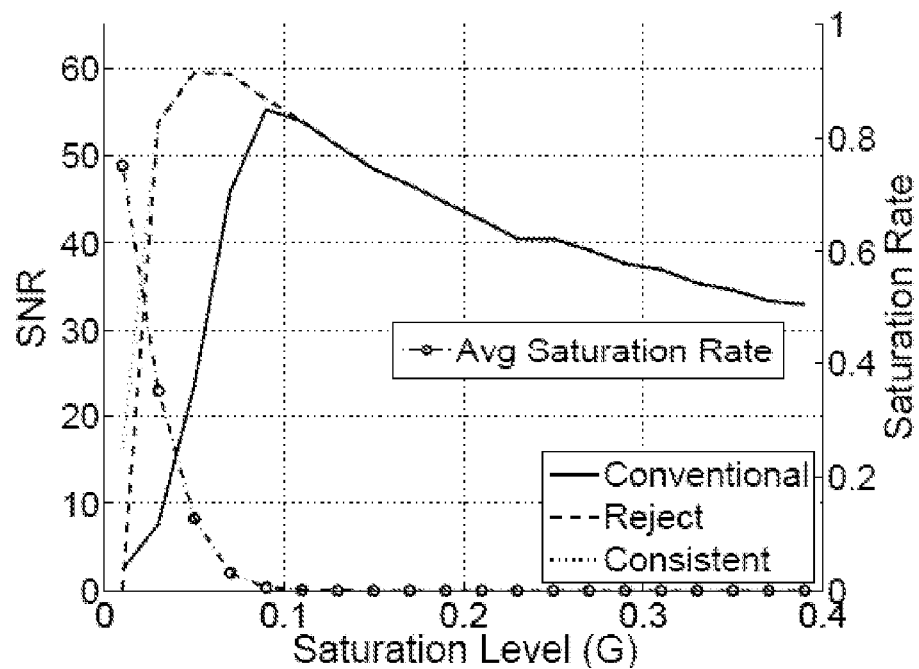

FIG. 4 is a comparison of reconstruction approaches using CVX for K-sparse signals with N=1024, K=20, and B=4. The solid line depicts reconstruction SNR for the conventional approach. The dotted line depicts reconstruction SNR for the consistent approach of a preferred embodiment of the present invention. The dashed line depicts reconstruction SNR for the rejection approach of another preferred embodiment of the present invention. SNR curves are measured on the left y-axis. The dashed-circled line, measured on the right y-axis, represents the average saturation rate. Each plot represents a different measurement regime: FIG. 4A low M/N=2/16, FIG. 4B medium M/N=6/16, and FIG. 4C high M/N=15/16.

Figure 5A:
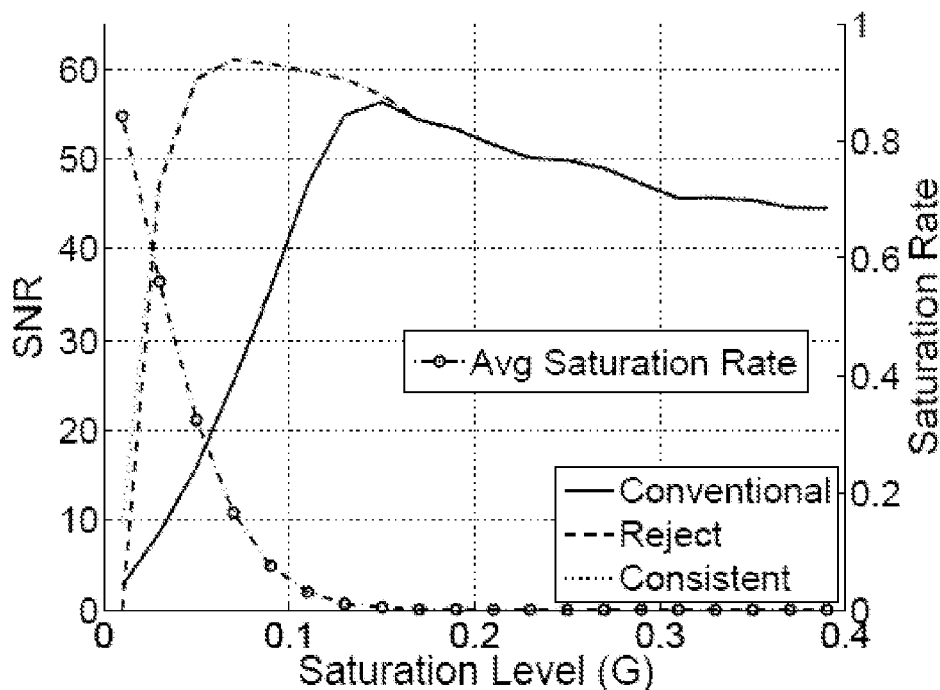
Figure 5B:
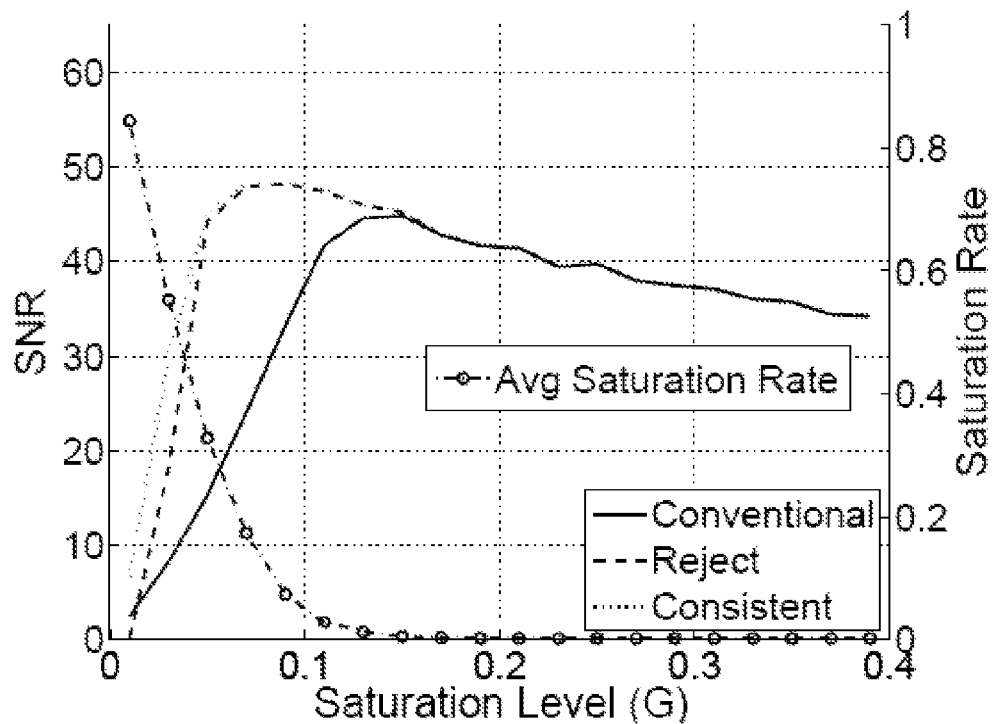
Figure 5C:
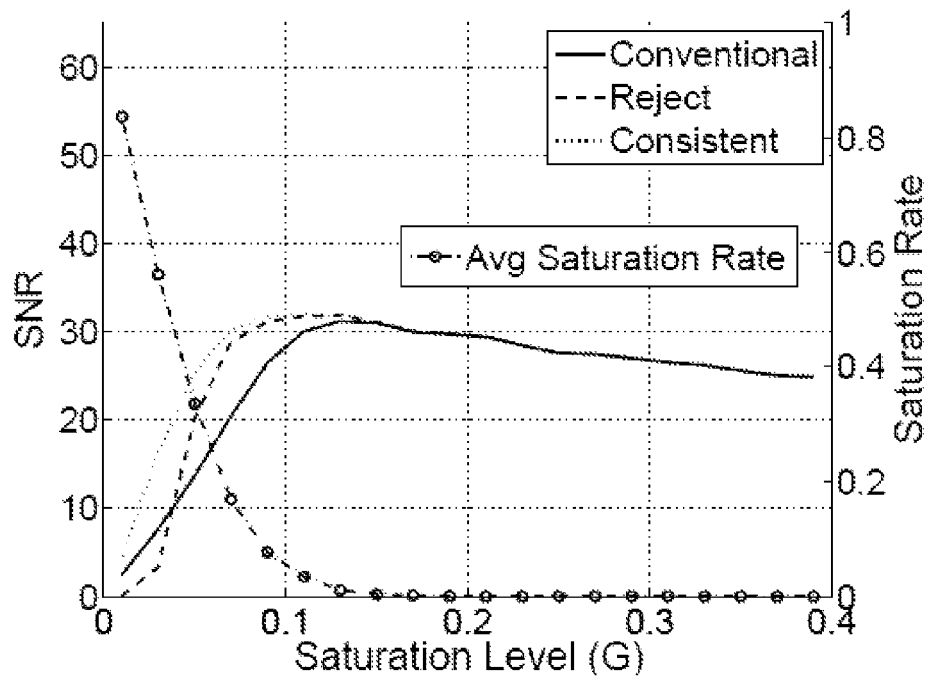

FIGS. 5A-C are comparisons of reconstruction approaches using CVX for weak $l_p$ compressible signals with N=1024, M/N=6/16, and B=4. The solid line depicts reconstruction SNR for the conventional approach in accordance with a preferred embodiment of the present invention. The dotted line depicts reconstruction SNR for the consistent approach in accordance with another preferred embodiment of the present invention. The dashed line depicts reconstruction SNR for the rejection approach. SNR curves are measured on the left y-axis. The dashed-circled line, measured on the right y-axis, represents the average saturation rate. Each plot represents different rate of decay for the coefficients: FIG. 5A fast decay p=0.4, FIG. 5B medium decay p=0.8, and FIG. 5C slow decay p=1.

Figure 6A:
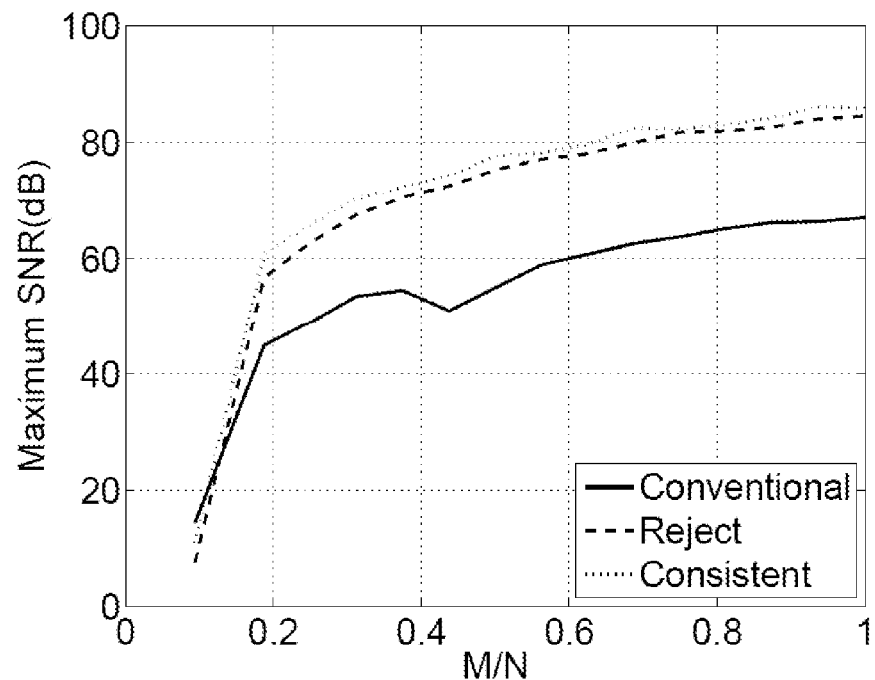
Figure 6B:
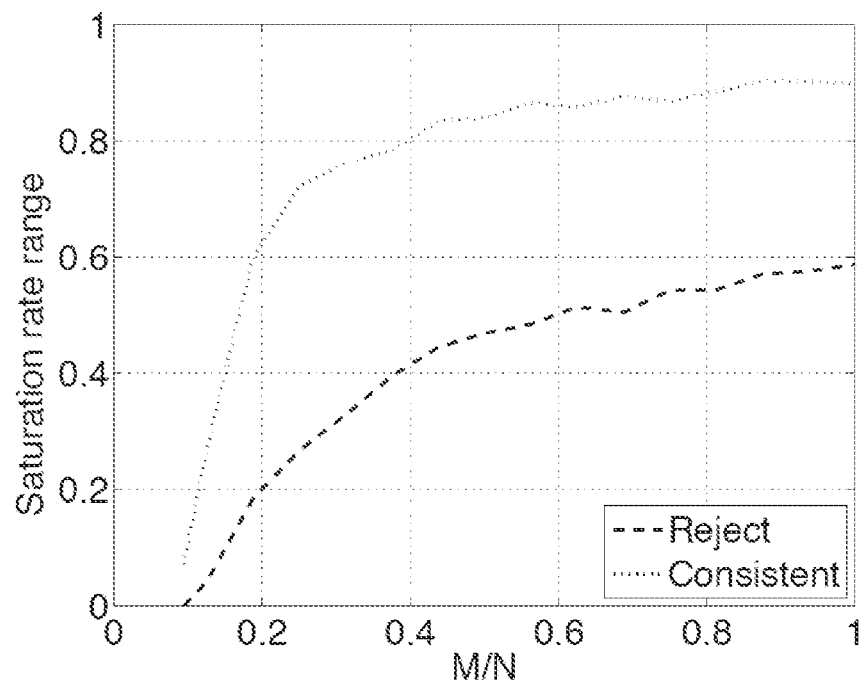

FIGS. 6A-B show the SNR performance using SC-CoSaMP for N=1024, K=20, and B=4. FIG. 6A shows the best-achieved average SNR vs. M/N. FIG. 6B shows the maximum saturation rate such that average SNR performance is as good or better than the best average performance of the conventional approach. For best-case saturation-level parameters, the rejection and constraint approaches of the preferred embodiments of the present invention can achieve SNRs exceeding the conventional SNR performance by 20 dB. The best performance between the rejection and consistent approaches of the present invention is similar, differing only by 3 dB, but the range of saturation rates for which they achieve high performance is much larger for the consistent approach. Thus, the consistent approach is more robust to saturation.

4 DETAILED DESCRIPTION OF THE PREFERRED EMBODIMENTS

Before describing preferred embodiments of the present invention for handling saturated measurements in greater detail, some notation is established that will prove useful for the remainder of the description. Let $\Gamma \subset \{1, 2, \ldots, M\}$. By $\Phi^\Gamma$ we mean the $|\Gamma| \times M$ matrix obtained by selecting the rows of $\Phi$ indexed by $\Gamma$. Alternatively, if $\Lambda \subset \{1, 2, \ldots, N\}$, then we use $\Phi_\Lambda$ to indicate the $M \times |\Lambda|$ matrix obtained by selecting the columns of $\Phi$ indexed by $\Lambda$.

4.1 Recovery Via Saturation Rejection

Figure 1A:
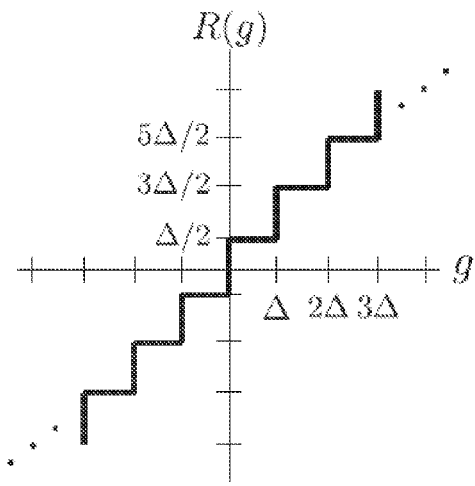
Figure 1B:
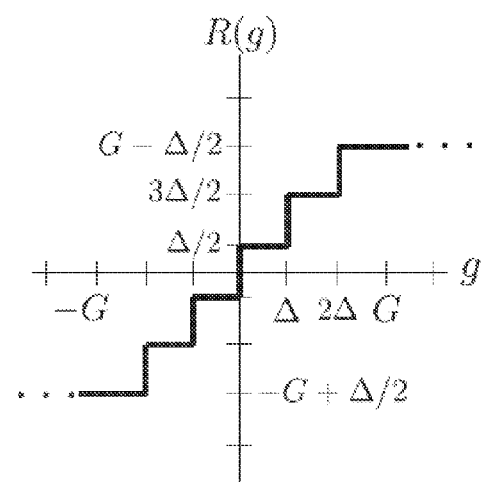
Figure 2:
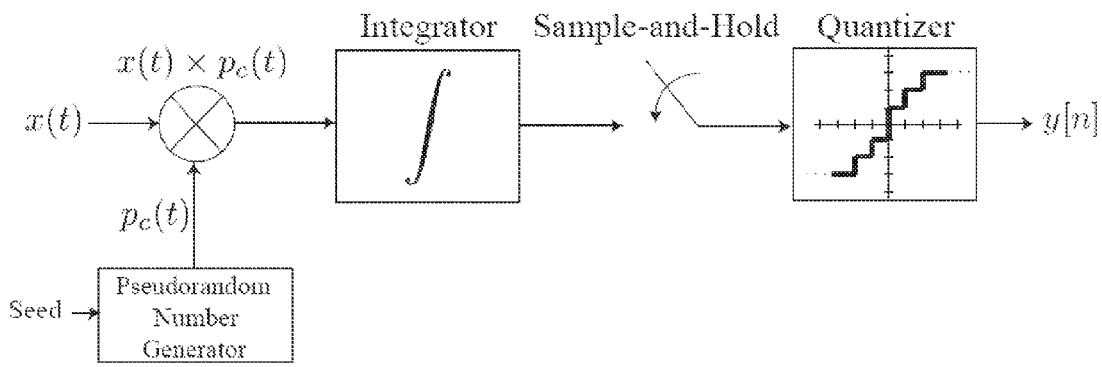
FIG. 2 is a drawing of a random demodulator compressive ADC.
Figure 3A:
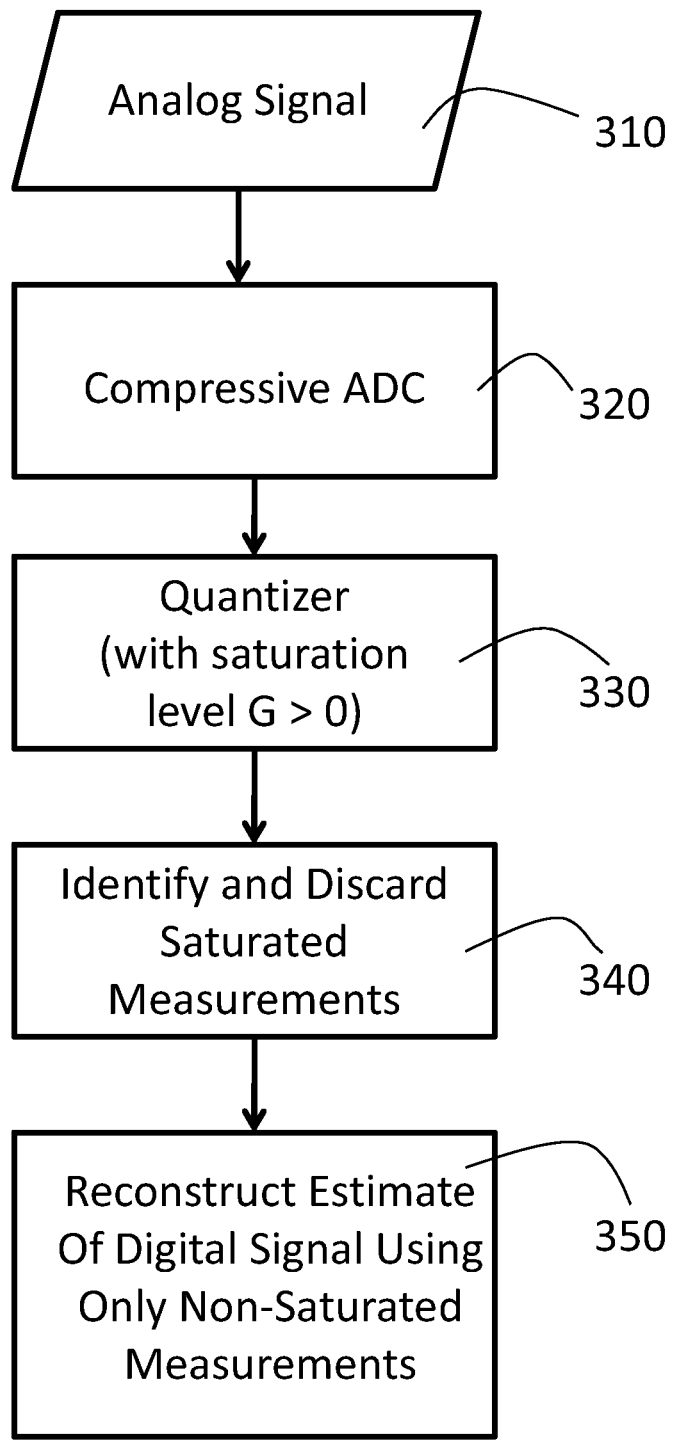
FIG. 3A is a flow chart illustrating a method for acquiring signals in accordance with a preferred embodiment of the present invention.

One way to handle saturated measurements is to simply discard them. See J. Laska, P. Boufounos, and R. Baraniuk, "Finite-range scalar quantization for compressive sensing," in *Proc. Sampling Theory and Applications (SampTA)*, Marseille, France, May 2009. A preferred embodiment of the present invention using saturation rejection is described with reference to FIG. 3A. An analog signal 310 is input to or received by a compressive analog-to digital converter (ADC) 320. The signal is quantized at quantizer 330 with a saturation level G that is greater than zero. The saturated measurements are identified and discarded 340. The signal is then reconstructed or estimated 350, for example, by software running on a processor, as follows by using only the non-saturated measurements. Denote the vector of the measurements that did not saturate as $\tilde{y}$ with length $\tilde{M}$. The matrix $\tilde{\Phi}$ is created by selecting the rows of $\Phi$ that correspond to the elements of $\tilde{y}$. Then, as an example, using (3) for reconstruction yields the program:

$$\hat{x} = \underset{x}{\operatorname{argmin}} \|x\|_1 \text{ s.t. } \|\tilde{\Phi}x - \tilde{y}\|_2 \leq \epsilon. \quad (4)$$

There are several advantages to this approach. Any fast or specialized recovery algorithm can be employed without modification. In addition, the speed of most algorithms will be increased since fewer measurements are used.

The saturation rejection approach can also be applied in conjunction with processing and inference techniques such as the smashed filter M. Davenport, M. Duarte, M. Wakin, J. Laska, D. Takhar, K. Kelly, and R. Baraniuk, "The smashed filter for compressive classification and target recognition," in *Proc. SPIE Elec. Imaging: Comput. Imaging*, San Jose, Calif., January 2007 for detection, which utilizes the inner products $\langle \Phi u, \Phi v \rangle$ between the measurement of vectors u, v. Such techniques depend on $\langle \Phi u, \Phi v \rangle$ being close to $\langle u, v \rangle$. Saturation can induce unbounded errors in $\langle \Phi u, \Phi v \rangle$, making it arbitrarily far away from $\langle u, v \rangle$. Thus, by discarding saturated measurements, the error between these inner products is bounded.

4.2 Recovery Via Convex Optimization with Consistency Constraints

Clearly saturation rejection discards potentially useful information. Thus, in a second embodiment of the present invention, saturated measurements are included but are treated differently from the others by enforcing consistency. Consistency means that we constrain the recovered signal $\hat{x}$ so that the magnitudes of the values of $\Phi\hat{x}$ corresponding to the saturated measurements are greater than G.

Figure 3B:
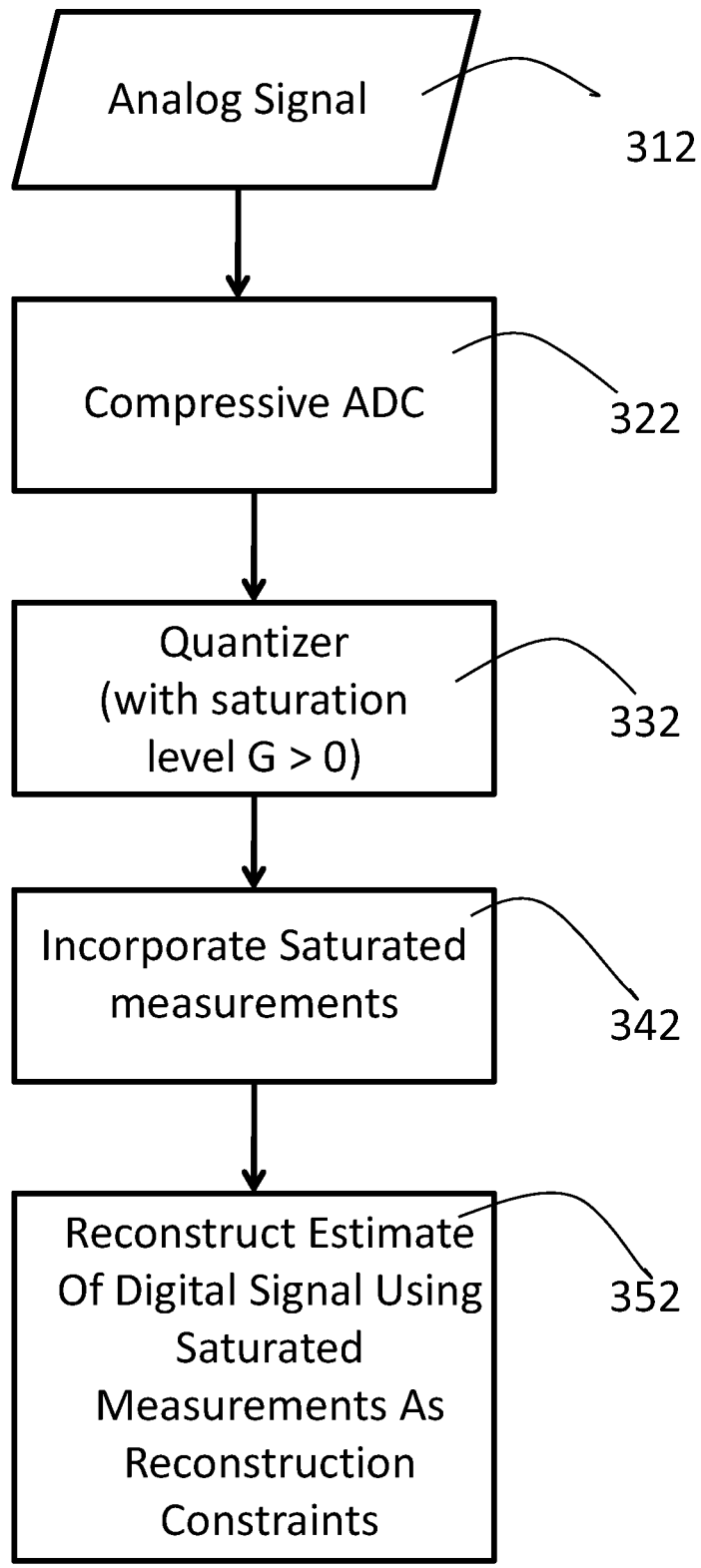
FIG. 3B is a flow chart illustrating a second method for acquiring signals in accordance with a preferred embodiment of the present invention.

A second preferred embodiment of the present invention using saturation consistency is described with reference to FIG. 3B. An analog signal 312 is input to or received by a compressive analog-to digital converter (ADC) 322. The signal is quantized at quantizer 332 with a saturation level G that is greater than zero. The saturated measurements are identified 342 for incorporation into the reconstruction algorithm. The signal is then reconstructed or estimated 352, for example, by software running on a processor, as follows.

Specifically, let S+ and S− correspond be the sets of indices of the positive saturated measurements, and negative saturated measurements, respectively. We define the matrix $\overset{\circ}{\Phi}$ as $$\overset{\circ}{\Phi} := \begin{bmatrix} \Phi^{S+} \\ -\Phi^{S-} \end{bmatrix}. \quad (5)$$

We obtain an estimate $\hat{x}$ via the program, $$\hat{x} = \underset{x}{\operatorname{argmin}} \|x\|_1 \text{ s.t. } \|\tilde{\Phi}x - \tilde{y}\|_2 < \epsilon \quad (6a)$$

and $$\overset{\circ}{\Phi}x \geq G \cdot 1, \quad (6b)$$

where 1 denotes an $(M-\tilde{M}) \times 1$ vector of ones. In words, we are looking for the x with the minimum $l_1$ norm such that the measurements that do not saturate have bounded $l_2$ error, and the measurements that do saturate are consistent with the saturation constraint. Alternative regularization terms that impose the consistency requirement on the unsaturated quantized measurements can be used on $\tilde{y}$, such as those proposed in L. Jacques, D. Hammond, and M. Fadili, "Dequantizing compressed sensing: When oversampling and non-gaussian contraints combine," *Preprint*, 2009, W. Dai, H. Pham, and O. Milenkovic, "Distortion-rate functions for quantized compressive sensing," *Preprint*, 2009, or alternative techniques for the unsaturated quantized measurements can be used such as those proposed in A. Zymnis, S Boyd, and E. Candès, "Compressed sensing with quantized measurements," *Preprint*, 2009. In some hardware systems, the measurements that are acquired following a saturation event can have higher distortion than the other unsaturated measurements. This is a physical effect of some quantizers and may happen when the sample rate is high. In this case, an additional $l_2$ constraint, $\|\tilde{\Phi}^* x - \tilde{y}^*\|_2 < \epsilon_1$, can be applied where * denotes the indices of the measurements immediately following a saturation event and where $\epsilon_1 > \epsilon$. The measurements $\tilde{y}^*$ can be determined via measured properties of the physical system.

---

Algorithm 1 SC-CoSaMP greedy algorithm

1:     Input: y, $\Phi$, and K
2:     Initialize: $\hat{x}^{[0]} \leftarrow 0$, $n \leftarrow 0$
3:     while not converged do
4:        Compute proxy:
5:        $p \leftarrow \tilde{\Phi}^T(\tilde{y} - \tilde{\Phi}\hat{x}^{[n]}) + \overset{\circ}{\Phi}^T(G \cdot 1 - \overset{\circ}{\Phi}\hat{x}^{[n]})_+$
        Update coefficient support:
        $\Omega \leftarrow$ union of
          • support of largest 2K coefficients from p
          • support of $\hat{x}^{[n]}$
6:        Estimate new coefficient values:
        $\hat{x}^{[n+1]} \leftarrow \operatorname{argmin}_x \|\tilde{y} - \tilde{\Phi}_\Omega x\|_2^2 + \|(G \cdot 1 - \overset{\circ}{\Phi}_\Omega x)_+\|_2^2$
7:        Prune:
        $\hat{x}^{[n+1]} \leftarrow$ keep largest K coefficients of $\hat{x}^{[n+1]}$
8:        $n \leftarrow n + 1$
9:     end while

---

4.3 Recovery Via Greedy Algorithms with Consistency Constraints

Greedy algorithms can also be modified to include a saturation constraint. One example of a greedy algorithm that is typically used for sparse recovery is CoSaMP D. Needell and J. Tropp, "CoSaMP: Iterative signal recovery from incomplete and inaccurate samples," *Appl. Comput. Harmon. Anal.*, vol. 26, no. 3, pp. 301-321, 2009. In this subsection, we introduce *Saturation Consistent CoSaMP* (SC-CoSaMP), a modified version of CoSaMP that performs consistent reconstruction with saturated measurements.

CoSaMP estimates the signal ic by finding a coefficient support set $\Omega$ and estimating the signal coefficients over that support. The support is found in part by first computing a vector $p = \Phi^T(y - \Phi\hat{x})$, that allows us to infer large signal coefficients, and hence is called the proxy vector D. Needell and J. Tropp, "CoSaMP: Iterative signal recovery from incomplete and inaccurate samples," *Appl. Comput. Harmon. Anal.*, vol. 26, no. 3, pp. 301-321, 2009, and second, by choosing the support of the largest 2K elements of p. These 2K support locations are merged with the support corresponding to the largest K coefficients of $\hat{x}$ to produce $\Omega$. Given $\Omega$, CoSaMP estimates the signal coefficients by solving the least squares problem:

$$\hat{x} = \min_x \|\Phi_\Omega x - y\|_2^2. \quad (7)$$

These steps are done successively until the algorithm converges.

Two steps of CoSaMP are modified to produce SC-CoSaMP; the proxy step and the coefficient estimate step. When computing the proxy vector, SC-CoSaMP enforces consistency from the contribution of the saturated measurements. When estimating the coefficients, a constraint on the saturated measurements is added to (7).

The steps of SC-CoSaMP are displayed in Algorithm 1. In steps 1 and 2, the algorithm initializes by choosing an estimate $\hat{x}^{[0]}$–0, an N-dimensional vector of zeros, where the superscript [•] denotes iteration. To recover K coefficients, the algorithm loops until a condition in step 3 is met. For each iteration n, the algorithm proceeds as follows:

The proxy vector is computed in step 4. This is accomplished by computing the sum of two proxy vectors; a proxy from $\tilde{y}$ and a proxy that uses the supports of the saturated measurements. To compute the proxy from $\tilde{y}$, the same computation as in CoSaMP is repeated, $\tilde{\Phi}^T(\tilde{y} - \tilde{\Phi}\hat{x}^{[n]})$, where the superscript T denotes the matrix transpose. To compute the proxy from the support of the measurements that saturated, the saturation residual is introduced, denoted as $G \cdot 1 - \overset{\circ}{\Phi} \hat{x}^{[n]}$. This vector measures how close the elements of $\overset{\circ}{\Phi} \hat{x}$ are to G. In consistent reconstruction, the magnitude of the elements of $\overset{\circ}{\Phi} \hat{x}$ should be greater than or equal to G, however, once these are greater than G, the magnitude given by the saturation residual cannot be effectively interpreted.

Thus, consistency is achieved by applying a function that selects the positive elements of the saturation residual, $$(y_i)_+ = \begin{cases} 0, & y_i < 0 \\ y_i, & y_i \geq 0, \end{cases} \quad (8)$$

where the function is applied element-wise when operating on a vector.

By combining the proxies from $\tilde{y}$ and the saturated measurement supports, the proxy vector of step 4 is $$p = \tilde{\Phi}^T(\tilde{y} - \tilde{\Phi}\hat{x}^{[n]}) + \overset{\circ}{\Phi}^T(G \cdot 1 - \overset{\circ}{\Phi} \hat{x}^{[n]})_+. \quad (9)$$

In this arrangement, the elements of $\overset{\circ}{\Phi} \hat{x}$ that are below G will contribute new information to p, however, elements that are greater than G will be set to zero, and therefore do not contribute additional information to p. We note that a similar computation can be made in the IHT algorithm T. Blumensath and M. Davies, "Iterative hard thresholding for compressive sensing," *Appl. Comput. Harmon. Anal.*, vol. 27, no. 3, pp. 265-274, 2009.

In step 5, the new coefficient support $\Omega$ is found by taking the union of the support of the largest 2K coefficients of p and the support of $\hat{x}^{[n]}$. This results in a support set $\Omega$ with at most 3K elements. This step ensures that if coefficients were incorrectly chosen in a previous iteration, they can be replaced.

In step 6 new coefficient values are estimated by finding the x that minimizes $\|\Phi_\Omega x - y\|_2^2$. Thus in CoSaMP, new coefficient values are estimated via $\Phi_\Omega^\backslash y$, where \ denotes the Moore-Penrose pseudo-inverse, i.e., $\Phi_\Omega^\backslash = (\Phi_\Omega^T \Phi_\Omega)^{-1}\Phi_\Omega^T$. We reformulate this step to include the saturation constraint. Specifically, step 6 of SC-CoSaMP finds the solution to $$\hat{x}^{[n+1]} \leftarrow \underset{x}{\operatorname{argmin}} \|\tilde{y} - \tilde{\Phi}_\Omega x\|_2^2 + \left\|(G \cdot 1 - \overset{\circ}{\Phi}_\Omega x)_+\right\|_2^2 \quad (10)$$

This can be achieved via gradient descent or other optimization techniques. By employing a one-sided quadratic we ensure a soft application of the constraint and ensure the program is feasible even in the presence of noise P. Boufounos and R. Baraniuk, "1-bit compressive sensing," in *Proc. Conf. Inform. Science and Systems (CISS)*, Princeton, N.J., March 2008.

In step 7, we keep the largest K coefficients of the signal estimate. The algorithm repeats until a convergence condition is met.

As demonstrated, SC-CoSaMP is different from CoSaMP in steps 4 and 6. In practice, we have found that applying step 4 of SC-CoSaMP to compute p provides a significant increase in performance over the equivalent step in CoSaMP, while applying step 6 for coefficient estimation provides only a marginal performance increase.

5 PROOF OF VALIDITY

5.1 Proof that Random Measurements are Democratic

In this section we develop a strong notion of democratic measurements and we demonstrate that the random measurement schemes typically advocated in CS are democratic, i.e., that each measurement contributes a similar amount of information about the signal x to the compressed representation y. Our definition significantly strengthens the informal (and weak) notion of democracy in the existing literature.

The fact that random measurements are democratic seems intuitive; when using random measurements, each measurement is a randomly weighted sum of a large fraction (or all) of the coefficients of x, and since the weights are chosen independently at random, no preference is given to any particular set of coefficients. More concretely, suppose that the measurements $y_1, y_2, \ldots, y_M$ are independent and identically distributed (i.i.d.) according to some distribution $f_y$, as is the case for the $\Phi$ considered in this paper. Now suppose that we select $\tilde{M}<M$ of the $y_i$ at random (or according to some procedure that is independent of y). Then we are left with a length-$\tilde{M}$ measurement vector $\tilde{y}$ such that each $\tilde{y}_i \sim f_y$. Stated another way, if we set $D=M-\tilde{M}$, then there is no difference between collecting $\tilde{M}$ measurements and collecting M measurements and deleting D of them, provided that this deletion is done independently of the actual values of y.

However, following this line of reasoning will ultimately lead to a rather weak definition of democracy. To see this, consider the case where the measurements are deleted by an adversary. Since by adaptively deleting the entries of y one can change the distribution of $\tilde{y}$, the adversary can delete the D largest elements of y, thereby skewing the distribution of $\tilde{y}$. In many cases, especially if the same matrix $\Phi$ will be used repeatedly with different measurements being deleted each time, it would be far better to know that any M measurements will be sufficient to robustly reconstruct the signal.

This is a significantly stronger requirement. Our aim is to formalize this property using the RIP, and then to demonstrate that random matrix constructions most commonly used in CS do indeed satisfy this property. Thus, we begin with the formal definition of democracy.

Definition 2

Let $\Phi$ be and M×N matrix, and let $\tilde{M} \leq M$ be given. We say that $\Phi$ is ($\tilde{M}$, K, $\delta$)-democratic if for all $\Gamma$ such that $\Gamma \leq \tilde{M}$ the matrix $\Phi^\Gamma$ satisfies the RIP of order K with constant $\delta$.

If $\Phi$ is ($\tilde{M}$, 2K, $\delta$)-democratic, then both approaches described in Section ?? will recover sparse and compressible signals. In particular, the democracy property implies that any $\tilde{M} \times N$ submatrix of $\Phi$ has RIP, and in particular that $\tilde{\Phi}$ satisfies the RIP. Thus, if $\delta < \sqrt{2}-1$, it immediately follows from Theorem 1 that the rejection approach (4) yields a recovered signal that satisfies (1) whenever the number of unsaturated measurements exceeds $\tilde{M}$. Furthermore, under the same conditions, we also have that (6) yields a recovered signal (1). This can be seen by observing that the proof of Theorem 1 in E. Candès, "The restricted isometry property and its implications for compressed sensing," *Comptes rendus de l'Académie des Sciences, Série I*, vol. 346, no. 9-10, pp. 589-592, 2008 essentially depends on only three facts: (i) that the original signal x is in the feasible set, so that we can conclude (ii) that $\|\hat{x}\|_1 \leq \|x\|_1$, and finally (iii) that $\|\Phi\hat{x} - \Phi x\|_2 \leq \epsilon$, where $\Phi$ can be any matrix that satisfies the RIP of order 2K with constant $\delta < \sqrt{2}-1$. Since $\Phi$ is democratic we have that (iii) holds for $\tilde{\Phi}$ regardless of whether we incorporate the additional constraints. Since the original signal x will remain feasible in (6), (i) and (ii) will also hold.

Note that the two approaches will not necessarily produce the same solution. This is because the solution from the rejection approach may not lie in the feasible set of solutions of the consistent approach (6). However, the reverse is true. The solution to the consistent approach does lie in the feasible set of solutions to the rejection approach. While we do not provide a detailed analysis that compares the performance of these two approaches, we expect that the consistent approach will outperform the rejection approach since it incorporates additional information about the signal. We provide experimental confirmation of this in Section 6.

We now demonstrate that certain randomly generated matrices are democratic. While the theorem actually holds (with different constants) for the more general class of sub-Gaussian matrices, for simplicity we restrict our attention to Gaussian matrices.

Theorem 2.

Let $\Phi$ by an M×N matrix with elements $\Phi_{ij}$ drawn according to $\mathcal{N}(0, 1/M)$ and let $\tilde{M} \leq M$, $K < \tilde{M}$, and $\delta \in (0, 1)$ be given. Define $D = M - \tilde{M}$. If $$M = C_1 (K+D) \log\left(\frac{N+M}{K+D}\right), \tag{11}$$

then with probability exceeding $1 - 3e^{-C_2 M}$ we have that $\Phi$ is ($\tilde{M}$, K, $\delta/(1-\delta)$)-democratic, where $C_1$ is arbitrary and $C_2 = (\delta/8)^2 - \log(42e/\delta)/C_1$.

Proof.

Our proof consists of two main steps. We begin by defining the M×(N+M) matrix $A = [I \; \Phi]$ formed by appending $\Phi$ to the M×M identity matrix. Theorem 1 from J. Laska, M. Davenport, and R. Baraniuk, "Exact signal recovery from corrupted measurements through the pursuit of justice," in *Proc. Asilomar Conf on Signals Systems and Computers*, Asilomar, Calif., November 2009 demonstrates that under the assumptions in the theorem statement, with probability exceeding $1 - 3e^{-C_2 M}$ we have that A satisfies the RIP of order K+D with constant $\delta$. The second step is to use this fact to show that all possible $\tilde{M} \times N$ submatrices of $\Phi$ satisfy the RIP of order K with constant $\delta/(1-\delta)$.

Towards this end, we let $\Gamma \subset \{1, 2, \ldots, M\}$ be an arbitrary subset of rows such that $|\Gamma| = \tilde{M}$. Define $\Lambda = \{1, 2, \ldots, M\} \setminus \Gamma$ and note that $|\Lambda| = D$. Additionally, let $$P_\Lambda \triangleq A_\Lambda A_\Lambda^\dagger, \tag{12}$$

be the orthogonal projector onto $\mathcal{R}(A_\Lambda)$, i.e., the range, or column space, of $A_\Lambda$. Furthermore, we define $$P_\Lambda^\perp \triangleq I - P_\Lambda, \tag{13}$$

as the orthogonal projector onto the orthogonal complement of $\mathcal{R}(A_\Lambda)$. In words, this projector nulls the columns of A corresponding to the index set $\Lambda$. Now, note that $\Lambda \subset \{1, 2, \ldots, M\}$, so $A_\Lambda = I_\Lambda$. Thus, $$P_\Lambda = I_\Lambda I_\Lambda^\dagger = I_\Lambda (I_\Lambda^T I_\Lambda)^{-1} I_\Lambda^T = I_\Lambda I_\Lambda^T = I(\Lambda),$$

where we use $I(\Lambda)$ to denote the M×M matrix with all zeros except for ones on the diagonal entries corresponding to the columns indexed by $\Lambda$. (We distinguish the M×M matrix $I(\Lambda)$ from the M×D matrix $I_\Lambda$—in the former case we replace columns not indexed by $\Lambda$ with zero columns, while in the latter we remove these columns to form a smaller matrix.) Similarly, we have $$P_\Lambda^\perp = I - P_\Lambda = I(\Gamma).$$

Thus, we observe that the matrix $P_\Lambda^\perp A = I(\Gamma) A$ is simply the matrix A with zeros replacing all entries on any row i such that $i \notin \Gamma$, i.e., $(P_\Lambda^\perp A)^\Gamma = A^\Gamma$ and $(P_\Lambda^\perp A)^\Lambda = 0$. Furthermore, Theorem 2 from M. Davenport, P. Boufounos, and R. Baraniuk, "Compressive domain interference cancellation," in *Structure et parcimonie pour la representation adaptative de signaux* (SPARS), Saint-Malo, France, April 2009 states that for A satisfying the RIP of order K+D with constant $\delta$, we have that $$\left(1 - \frac{\delta}{1-\delta}\right)\|u\|_2^2 \leq \|P_\Lambda^\perp A u\|_2^2 \leq (1+\delta)\|u\|_2^2, \tag{14}$$

holds for all $u \in \mathbb{R}^{N+M}$ such that $\|u\|_0 = K+D-|\Lambda|=K$ and $\text{supp}(u) \cap \Lambda = \emptyset$. Equivalently, letting $\Lambda^c = \{1, 2, \ldots, N+M\} \setminus \Lambda$, this result states that $(I(\Gamma)A)_{\Lambda^c}$ satisfies the RIP of order K with constant $\delta/(1-\delta)$. To complete the proof, we note that if $(I(\Gamma)A)_{\Lambda^c}$ satisfies the RIP of order K with constant $\delta/(1-\delta)$, then we trivially have that $I(\Gamma)\Phi$ also has the RIP of order at least K with constant $\delta/(1-\delta)$, since $I(\Gamma)\Phi$ is just a submatrix of $(I(\Gamma)A)_{\Lambda^c}$. Note that this trivially implies that the RIP of $I(\Gamma)\Phi$ holds for $|\Gamma| \geq \tilde{M}$. Since $\|I(\Gamma)\Phi x\|_2 = \|\Phi^\Gamma x\|_2$, this establishes the theorem.

5.2 Robustness and Stability

Observe that we require roughly $O(D \log(N))$ additional measurements to ensure that $\Phi$ is ($\tilde{M}$, K, $\delta$)-democratic compared to the number of measurements required to simply ensure that $\Phi$ satisfies the RIP of order K. This seems intuitive; if we wish to be robust to the loss of any D measurements while retaining the RIP of order K, then we should expect to take at least D additional measurements. This is not unique to the CS framework. For instance, by oversampling, i.e., sampling faster than the minimum required Nyquist rate, uniform sampling systems can also improve robustness with respect to the loss of measurements. Reconstruction can be performed in principle on the remaining non-uniform grid, as long as the remaining samples satisfy the Nyquist range on average F. Beutler, "Error-free recovery of signals from irregularly spaced samples," *SIAM Rev., vol.* 8, pp. 328-335, July 1966.

However, linear reconstruction in such cases is known to be unstable. Furthermore the linear reconstruction kernels are difficult to compute. Under certain conditions stable non-linear reconstruction is possible, although this poses further requirements on the subset set of samples that can be lost and the computation can be expensive A. Aldroubi and K. Gröchenig, "Nonuniform sampling and reconstruction in shift-invariant spaces," *SIAM Rev., vol.* 43, no. 4, pp. 585-620, 2001. For example, dropping contiguous groups of measurements can be a challenge for the stability of the reconstruction algorithms. Instead, the democratic principle of CS we just proved allows dropping of an arbitrary subset D of the measurements without compromising the reconstruction stability, independent of the way these measurements are chosen, even if chosen adversarially.

In some applications, this difference may have significant impact. For example, in finite dynamic range quantizers, the measurements saturate when their magnitude exceeds some level. Thus, when uniformly sampling with a low saturation level, if one sample saturates, then the likelihood that any of the neighboring samples will saturate is high, and significant oversampling may be required to ensure any benefit. However, in CS, if many adjacent measurements were to saturate, then for only a slight increase in the number of measurements we can mitigate this kind of error by simply rejecting the saturated measurements; the fact that $\Phi$ is democratic ensures that this strategy will be effective.

Theorem 2 further guarantees graceful degradation due to loss of samples. Specifically, the theorem implies that reconstruction from any subset of CS measurements is stable to the loss of a potentially larger number of measurements than anticipated. To see this, suppose that and M×N matrix $\Phi$ is (M−D, K, δ)-democratic, but consider the situation where D+$\tilde{D}$ measurements are dropped. It is clear from the proof of Theorem 2 that if $\tilde{D}$<K, then the resulting matrix $\Phi^\Gamma$ will satisfy the RIP of order K−$\tilde{D}$ with constant δ. Thus, from E. Candès, J. Romberg, and T. Tao, "Stable signal recovery from incomplete and inaccurate measurements," *Comm. Pure and Appl. Math.*, vol. 59, no. 8, pp. 1207-1223, 2006, if we define $\tilde{K}=(K-\tilde{D})/2$, then the reconstruction error is then bounded by $$\|x - \hat{x}\|_2 \leq C_3 \frac{\|x - x_{\tilde{K}}\|_1}{\sqrt{\tilde{K}}}, \quad (15)$$

where $x_{\tilde{K}}$ denotes the best $\tilde{K}$-term approximation of x and $C_3$ is an absolute constant depending on $\Phi$ that can be bounded using the constants derived in Theorem 2. Thus, if $\tilde{D}$ is small then the additional error caused by dropping too many measurements will also be relatively small. To our knowledge, there is simply no analog to this kind of graceful degradation result for uniform sampling with linear reconstruction. When the number of dropped samples exceeds D, there is are no guarantees as to the accuracy of the reconstruction.

6 PROOF OF CONCEPT EXPERIMENTS

In the previous sections, we discussed three approaches for recovering sparse signals from finite-range, quantized CS measurements;

1. the conventional approach, scaling the signal so that the saturation rate is zero and reconstructing with the program (3);
2. the rejection approach, discarding saturated measurements before reconstruction with (4); and
3. the consistent approach, incorporating saturated measurements as a constraint in the program (6).

In this section we compare these approaches via a suite of simulations to demonstrate that, on average, using the saturation constraint outperforms the other approaches for a given saturation level G (or equivalently, a given signal gain). Note that for a scalar quantizer with a fixed number B of bits per sample, varying the quantizer saturation level G is exactly equivalent to varying the signal gain and keeping the saturation level G constant. Our main findings include:

In many cases the optimal performance for the consistent and rejection approaches is superior to the optimal performance for the conventional approach and occurs when the saturation rate is nonzero.

The difference in optimal performance between the consistent and rejection approaches is small for a given ratio of M/N.

The consistent reconstruction approach is more robust to saturation than the rejection approach. Also, for a large range of saturation rates, consistent reconstruction outperforms the conventional approach even if the latter is evaluated under optimal conditions.

We find these behaviors for both sparse and compressible signals and for both optimization and greedy recovery algorithms.

6.1 Experimental Setup

Signal Model:

We study the performance of our approaches using two signal classes:

K-sparse: in each trial, K nonzero elements $x_n$ are drawn from an i.i.d. Gaussian distribution and where the locations n are randomly chosen;

weak $l_p$-compressible: in each trial, elements $x_n$ are first generated according to $$x_n = v_n n^{-1/p}, \quad (16)$$

for $p \leq 1$ where $v_m$ is a ±1 Rademacher random variable. The positions n are then permuted randomly.

Once a signal is drawn, it is normalized to have unit $l_2$ norm. Aside from quantization we do not add any additional noise sources.

Measurement Matrix:

For each trial a measurement matrix is generated using an i.i.d. Gaussian distribution with variance 1/M. Our extended experimentation, not shown here in the interest of space, demonstrates consistent results across a variety of measurement matrix classes including i.i.d. ±1 Rademacher matrices and other sub-Gaussian matrices, as well as the random demodulator and random time-sampling.

Reconstruction Metric:

We report the reconstruction signal-to-noise ratio (SNR) in decibels (dB):

$$SNR \triangleq 10\log_{10}\left(\frac{\|x\|_2^2}{\|x - \hat{x}\|_2^2}\right), \quad (17)$$

where $\hat{x}$ denotes the reconstructed signal.

6.2 Reconstruction SNR: K-Sparse Signals

We compare the reconstruction performance of the three approaches by applying each to the same set of measurements. We fix the parameters, N=1024, K=20, and B=4 and vary the saturation level parameter G over the range [0, 0.4]. We varied the ratio M/N in the range [1/6,1] but plot results for only the three ratios M/N=2/16, 6/16, and 15/16 that exhibit typical behavior for their regime. For each parameter combination, we performed 100 trials, and computed the average performance. The results were similar for other parameters, thus those experiments are not displayed here.

The experiments were performed as follows. For each trial we draw a new sparse signal x and a new matrix $\Phi$ according to the details in Section 6.1 and compute y=$\Phi$x. We quantize the measurements using a quantizer with saturation level G and then use them to reconstruct the signal using the three approaches described above. In each approach, $\in$ is chosen to be the noise norm induced by quantization, and saturation error is included in the conventional case. The reconstructions were performed using CVX, a general purpose optimization package.

FIG. 4A, FIG. 4B, and FIG. 4C display the reconstruction SNR performance of the three approaches in dB for M/N=2/16, M/N=6/16, M/N=15/16, respectively. The solid line depicts the conventional approach, the dashed line depicts the rejection approach, and the dotted line depicts the consistent approach. Each of these lines follow the scale on the left y-axis. The dashed-circled line denotes the average saturation rate, (M−$\tilde{M}$)/M, and correspond to the right y-axis. In FIG. 4A, the three lines meet at G=0.25, as expected, because the saturation rate is effectively zero at this point. This is the operating point for the conventional approach and is the largest SNR value for the solid line. In this case, only the consistent approach obtains SNRs greater than the conventional approach. In FIG. 4B, the three lines meet at G=0.15. Both the consistent and the rejection approaches achieve their optimal performance at around G=0.1, where the saturation rate is 0.09. In FIG. 4C, the three lines meet at G=0.1 and both the consistent and rejection approaches achieve their optimal performance at G=0.06.

The implications of this experiment are threefold: First, the saturation constraint offers the best approach for reconstruction. Second, if the signal is very sparse or there is an excess of measurements, then saturated measurements can be rejected with negligible loss in performance. Third, if given control over the parameter G, then the quantizer should be tuned to operate with a positive saturation rate.

6.3 Reconstruction SNR: Compressible Signals

In addition to sparse signals, we also compare the reconstruction performance of the three approaches with compressible signals. As in the strictly sparse experiments, we use CVX for reconstruction Similar to the sparse reconstruction experiments, we choose the parameters, N=1024, M/N=6/16, and B=4 and vary the saturation level parameter G over the range [0, 0.4]. The decay parameter p is varied in the range [0.4, 1], but we will discuss only three decays p=0.4, 0.8, and 1. Some signals are known to exhibit p in (16) in this range, for instance, it has been shown that the wavelet coefficients of natural images have decay rates between p=0.3 and p=0.7 R. DeVore, B. Jawerth, and B. Lucier, "Image compression through wavelet transform coding," *IEEE Trans. Inform. Theory*, vol. 38, no. 2, 1992. For each parameter combination, we perform 100 trials, and compute the average performance. The experiments are performed in the same fashion as with the sparse signals.

For signals with smaller p, fewer coefficients are needed to approximate the signals with low error. This also implies that fewer measurements are needed for these signals. The plots in FIGS. 5A-C reflect this intuition. FIG. 5A, FIG. 5B, and FIG. 5C depict the results for p=0.4, p=0.8, and p=1, respectively. The highest SNR for p=0.4 is achieved at a saturation rate of 17%, while for p=0.8 the saturation rate can only be 13%, and for p=1 the highest SNR occurs at a saturation rate of 5%. This means that the smaller the p, the more the measurements should be allowed to saturate.

6.4 Robustness to Saturation

We also compare the optimal performance of the rejection and consistent reconstruction approaches. First, we find the maximum SNR versus MIN for these approaches and demonstrate that their difference is small. Second, we determine the robustness to saturation of each approach. Because these experiments require many more trials than in the previous experiments, we use SC-CoSaMP from Section 4.3 for the consistent approach and CoSaMP for the rejection and conventional approaches.

We experimentally measure, by tuning G, the best SNR achieved on average for the three strategies. The experiment is performed as follows. Using the same parameters as in the K-sparse experiments, for each value of M and for each approach, we search for the saturation level G that yields the highest average SNR and report this SNR. This is equivalent to finding the maximum point on each of the curves of each plot in FIGS. 4A-C but over a larger range of M.

FIG. 6A depicts the results of this experiment. The solid curve denotes the best performance for the conventional approach; the dashed curve denotes the performance with saturation rejection; and the dotted curve denotes the performance with the constraint. For these parameters, in the best case, saturation rejection can improve performance by 20 dB, and the saturation constraint can improve performance over the conventional case by 23 dB.

There are two important implications from this experiment. First, when the number of measurements exceeds the minimum required number of measurements, then intentionally saturating measurements can greatly improve performance. Second, in terms of the maximum SNR, the consistent approach performs only marginally better than the rejection approach, assuming that the quantizer operates under the optimal saturation conditions for each approach.

In practice it may be difficult to efficiently determine or maintain the saturation level that achieves the maximum SNR. In those cases, it is beneficial to know the robustness of each approach to changes in the saturation rate. Specifically, we compare the range of saturation rates for which the two approaches outperform the conventional approach when the latter is operating under optimal conditions.

This experiment first determines the maximum SNR achieved by the conventional approach (i.e., the solid curve in FIG. 6A). Then, for the other approaches, we increase the saturation rate by tuning the saturation level. We continue to increase the saturation rate until the SNR is lower than the best SNR of the conventional approach.

The results of this experiment are depicted in FIG. 6B. The dashed line denotes the range of saturation rates for the rejection approach and the dotted line denotes the range of saturation rates for the consistent approach. At best, the rejection approach achieves a range of [0, 0.6] while the consistent approach achieves a range of [0, 0.9]. Thus, these experiments show that the consistent approach is more robust to saturation rate.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for acquiring signals comprising the steps of:
   amplifying a signal;
   measuring the amplified signal with compressive sensing to produce a plurality of compressive sensing measurements, said measurements comprising a plurality of saturated measurements and a plurality of unsaturated measurements;
   identifying said plurality of saturated measurements;
   reconstructing said signal by treating said plurality of saturated measurements separately from said plurality of unsaturated measurements, wherein said reconstructing step comprises the step of:
   incorporating said plurality of saturated measurements as a reconstruction constraint in a reconstruction algorithm.

2. A method for acquiring signals comprising the steps of:
   amplifying a signal;
   measuring the amplified signal with compressive sensing to produce a plurality of compressive sensing measurements, said measurements comprising a plurality of saturated measurements and a plurality of unsaturated measurements;
   identifying said plurality of saturated measurements;
   reconstructing said signal by treating said plurality of saturated measurements separately from said plurality of unsaturated measurements
   wherein said reconstructing comprises the steps of:
   discarding said plurality of saturated measurements and using only said plurality of unsaturated measurements in a reconstruction algorithm.

3. A method for acquiring signals according to claim 1, wherein said reconstruction algorithm comprises a greedy algorithm.

4. A method for acquiring signals comprising the steps of:
   amplifying a signal;
   measuring the amplified signal with compressive sensing to produce a plurality of compressive sensing measurements, said measurements comprising a plurality of saturated measurements and a plurality of unsaturated measurements;
   identifying said plurality of saturated measurements;
   reconstructing said signal by treating said plurality of saturated measurements separately from said plurality of unsaturated measurements;
   wherein said amplifying step comprises the step of amplifying said signal a preselected amount to intentionally produce a plurality of saturated measurements at measuring step.

5. A method for acquiring signals according to claim 4, wherein said amplifying step is controlled by an automatic gain control system.

6. A method for recovering a signal comprising the steps of:
   measuring a signal to produce a plurality of compressive sensing measurements, wherein said plurality of compressive sensing measurements comprises saturated measurements and unsaturated measurements;
   discarding said saturated measurements from said plurality of compressive sensing measurements; and
   reconstructing said signal from remaining measurements from said plurality of compressive sensing measurements;
   wherein said amplifying step comprises amplifying said signal a sufficient amount to ensure that said measuring step will produce a plurality of saturated measurements.

7. A method for recovering a signal according to claim 6, further comprising the step of amplifying said signal prior to said measuring step.

8. A method for recovering a signal comprising the steps of:
   measuring a signal to produce a plurality of compressive sensing measurements, wherein said plurality of compressive sensing measurements comprises saturated measurements and unsaturated measurements;
   identifying saturated measurements in said plurality of compressive sensing measurements; and
   reconstructing said signal from both said saturated measurements and said unsaturated measurements, wherein said recovered signal is constrained such that magnitudes of values corresponding to said identified saturated measurements are greater than a predetermined value.

9. A method for recovering a signal according to claim 8, further comprising the step of amplifying said signal prior to said measuring step to introduce substantial saturation error.

10. A method for recovering a signal according to claim 8, wherein said amplifying step comprises amplifying said signal a sufficient amount to ensure that said measuring step will produce a plurality of saturated measurements.

11. A method for acquiring signals according to claim 8, wherein said reconstruction algorithm comprises a greedy algorithm.

12. A method for acquiring signals according to claim 2, wherein said amplifying step comprises the step of amplifying said signal a preselected amount to intentionally produce a plurality of saturated measurements at measuring step.

13. A method for acquiring signals according to claim 12, wherein said amplifying step is controlled by an automatic gain control system.

14. A method for acquiring signals according to claim 4, wherein said reconstruction algorithm comprises a greedy algorithm.

* * * * *